(12) United States Patent
Minzoni

(10) Patent No.: US 7,277,335 B2
(45) Date of Patent: Oct. 2, 2007

(54) OUTPUT CIRCUIT THAT TURNS OFF ONE OF A FIRST CIRCUIT AND A SECOND CIRCUIT

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 11/157,425

(22) Filed: Jun. 21, 2005

(65) Prior Publication Data

US 2006/0285403 A1 Dec. 21, 2006

(51) Int. Cl.
*G11C 7/00* (2006.01)

(52) U.S. Cl. ............. 365/196; 365/189.05; 365/230.08

(58) Field of Classification Search ................ 365/396, 365/189.05, 230.08, 196
See application file for complete search history.

(56) References Cited

U.S. PATENT DOCUMENTS

| | | | |
|---|---|---|---|
| 5,563,835 A * | 10/1996 | Oldham | ....................... 365/207 |
| 5,585,747 A | 12/1996 | Proebsting | |
| 5,959,919 A | 9/1999 | Choi | |
| 5,982,673 A | 11/1999 | Kiehl | |
| 6,031,775 A | 2/2000 | Chang et al. | |
| 6,515,528 B1 | 2/2003 | Tohsche | |
| 6,779,076 B1 | 8/2004 | Shirley | |
| 6,895,522 B2 * | 5/2005 | Johnson et al. | ............. 713/401 |

* cited by examiner

*Primary Examiner*—Son Dinh
*Assistant Examiner*—Nam t Nguyen
(74) *Attorney, Agent, or Firm*—Dicke, Billig & Czaja, PLLC

(57) ABSTRACT

An output circuit including a first circuit configured to provide a first output signal, a second circuit configured to provide a second output signal, and a third circuit. The third circuit is configured to receive a third output signal that is based on the first output signal and the second output signal. The third circuit is configured to provide enable signals that turn on one of the first circuit and the second circuit and turn off the other of the first circuit and the second circuit based on the third output signal that is updated via the turned on one of the first circuit and the second circuit.

14 Claims, 10 Drawing Sheets

US 7,277,335 B2

OUTPUT CIRCUIT THAT TURNS OFF ONE OF A FIRST CIRCUIT AND A SECOND CIRCUIT

BACKGROUND

Typically, a computer system includes a number of integrated circuit chips that communicate with one another to perform system applications. Chip speeds continue to increase and the amount of data communicated between chips continues to increase to meet the demands of system applications. As the volume of digital data communicated between chips increases, higher bandwidth communication links are needed to prevent data communication bottlenecks between chips. Higher bandwidth communication links can be made by communicating more signals in parallel and/or increasing input/output (I/O) bit speeds.

Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), and pseudo static RAM (PSRAM). Some computer systems include mobile system applications, which have limited space and limited power resources. In mobile applications, such as cellular telephones and personal digital assistants (PDAs), memory cell density and power consumption are issues for future generations. To address these issues, the industry is developing DRAM for mobile applications.

A DRAM, typically, includes one transistor and one capacitor memory cells arranged in one or more arrays of memory cells, which are arranged in memory banks. To read and write memory cells, each DRAM includes one or more row decoders, one or more column decoders, primary sense amplifiers, and secondary sense amplifiers. The primary sense amplifiers can be differential sense amplifiers, wherein each sense amplifier receives one bit line at each of two differential inputs.

To read or write memory cells, the DRAM receives a row address, a column address, and control signals, such as row address select (RAS) and column address select (CAS) signals. A row decoder receives the row address to select a row of memory cells and the row address is latched into the row decoder via the RAS signal. A column decoder receives the column address to select one or more columns of memory cells and the column address is latched into the column decoder via the CAS signal. Each memory cell at the intersection of a selected row and a selected column provides a data bit to a primary sense amplifier.

At each primary sense amplifier that receives data, one of the bit lines receives the data bit from a selected memory cell and the other bit line is used as a reference. To write a data bit into a selected memory cell, input drivers overdrive the primary sense amplifier. One input driver overdrives a data bit value onto the bit line that is connected to the selected memory cell and another input driver overdrives the inverse of the data bit value onto the reference bit line. To read the data bit, the primary sense amplifier amplifies the difference between the data bit value and the reference value and provides the data bit value to a secondary sense amplifier. The secondary sense amplifier receives the data bit value and provides a data bit output signal.

The secondary sense amplifiers are activated or turned on during each read command. Often, multiple data bits are read via a single read command and multiple secondary sense amplifiers, such as 64 or 128 secondary sense amplifiers, are turned on in parallel. The activated secondary sense amplifiers draw a large current through the power supply lines that may cause a drop in the power supply voltage at points distant from the power supply source. Drops in power supply voltage may cause the DRAM to become unreliable. Also, increasing bandwidth by communicating more signals in parallel and/or by increasing current consumption to make the secondary sense amplifiers faster exacerbates these reliability and power consumption problems.

For these and other reasons there is a need for the present invention.

SUMMARY

One aspect of the present invention provides an output circuit including a first circuit configured to provide a first output signal, a second circuit configured to provide a second output signal, and a third circuit. The third circuit is configured to receive a third output signal that is based on the first output signal and the second output signal. The third circuit is configured to provide enable signals that turn on one of the first circuit and the second circuit and turn off the other of the first circuit and the second circuit based on the third output signal that is updated via the turned on one of the first circuit and the second circuit.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
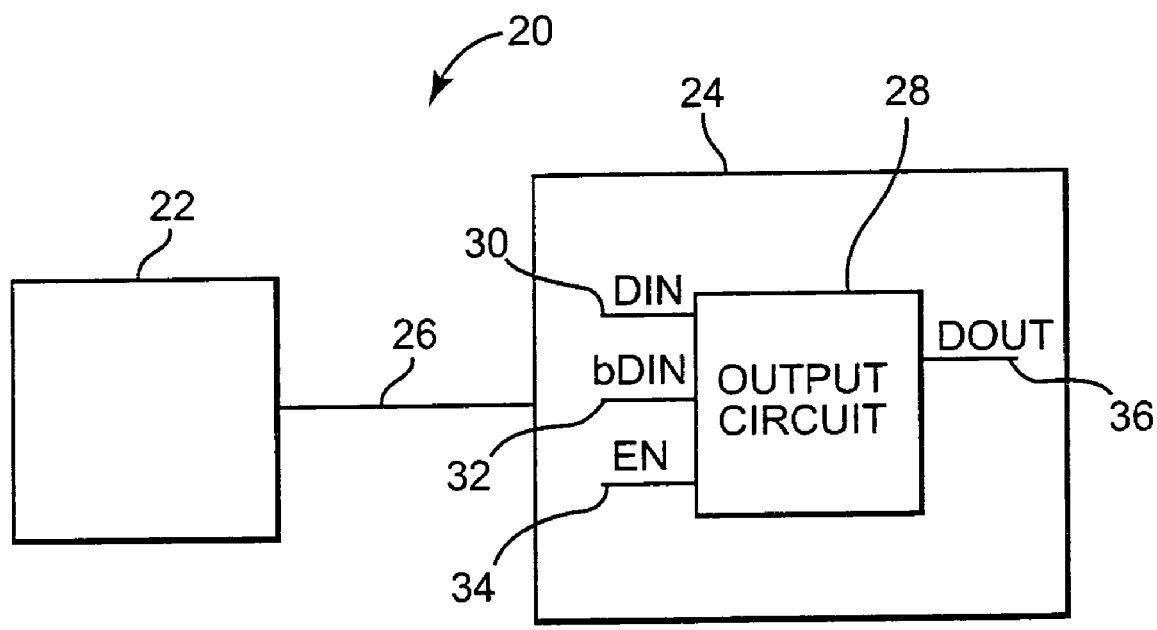
FIG. 1 is a block diagram illustrating one embodiment of a computer system according to the present invention.

FIG. 1 is a block diagram illustrating one embodiment of a computer system 20 according to the present invention. The computer system 20 includes a first integrated circuit chip 22 and a second integrated circuit chip 24. Chip 22 is electrically coupled to chip 24 via communications path 26. In one embodiment, chip 22 is a memory controller and chip 24 is a RAM, such as a DRAM, a DDR-SDRAM, a GDDR-SDRAM, an RLDRAM, or a PSRAM. The controller and RAM communicate with one another to perform system applications. In other embodiments, chip 22 and chip 24 can be any suitable chips that communicate with one another.

Chip 22 includes a suitable number of transmitter and receiver pairs and chip 24 includes a suitable number of transmitter and receiver pairs. Each transmitter and receiver pair in chip 22 corresponds to a transmitter and receiver pair in chip 24. Communications path 26 includes one or more signal pathways and each transmitter and receiver pair in chip 22 is electrically coupled to the corresponding transmitter and receiver pair in chip 24 via at least one of the signal pathways in communications path 26.

Chip 24 includes an output circuit 28 that receives a data input signal DIN at 30, an inverted data input signal bDIN at 32, and an enable signal EN at 34. Data input signal DIN at 30 and inverted data input signal bDIN at 32 indicate the high or low logic level of a data bit. Output circuit 28 includes two receivers that can differentiate between data input signal DIN at 30 and inverted data input signal bDIN at 32. One of the two receivers is configured to switch data output signal DOUT at 36 to a low logic level based on data input signal DIN at 30 and inverted data input signal bDIN at 32. The other of the two receivers is configured to switch data output signal DOUT at 36 to a high logic level based on data input signal DIN at 30 and inverted data input signal bDIN at 32. Output circuit 28 uses enable signal EN at 34 and data output signal DOUT at 36 to enable or activate one of the two receivers in output circuit 28. The activated receiver can switch data output signal DOUT at 36 from its present logic level to the other logic level. The other one of the two receivers in output circuit 28 is disabled or turned off to reduce current consumption.

Enabling one of the two receivers and disabling the other one of the two receivers reduces the amount of current consumed by output circuit 28. Voltage drops along power supply lines are reduced, which increases reliability. Also, each of the two receivers can be built to consume more current to increase the speed of output circuit 28 without exceeding power resources. Reliable and higher bandwidth communications between chip 22 and chip 24 can be maintained using increased data bit speeds and an increased number of output circuits, such as output circuit 28, in parallel.

In one embodiment, output circuit 28 includes recharge circuitry that recharges data output signal DOUT at 36. In one embodiment, output circuit 28 includes bias circuitry that biases one of the input signals, data input signal DIN at 30 or inverted data input signal bDIN at 32, to a voltage level that increases the sensitivity of the activated receiver. In one embodiment, chip 24 includes any suitable number of output circuits, such as output circuit 28, and chip 24 outputs any suitable number of data output signals, such as data output signal DOUT at 36, to chip 22 via communications path 26.

Figure 2:
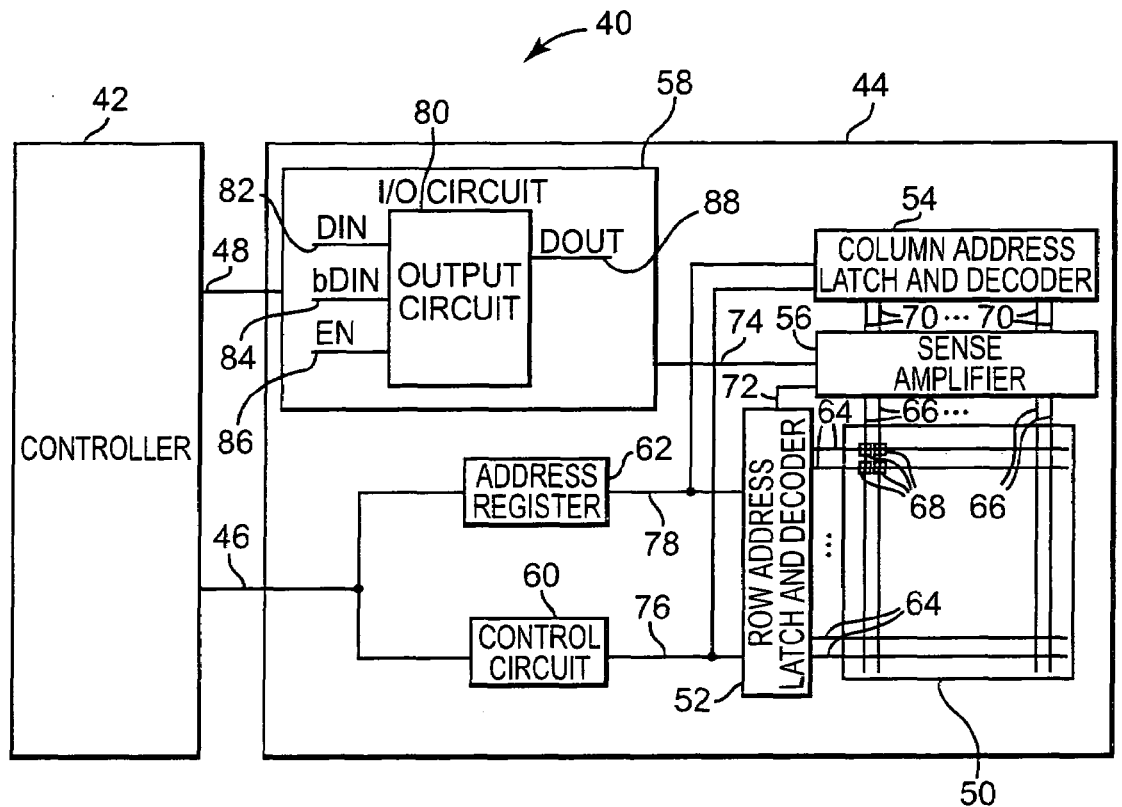
FIG. 2 is a block diagram illustrating one embodiment of a computer system according to the present invention including a controller and a RAM.

FIG. 2 is a block diagram illustrating one embodiment of a computer system 40 according to the present invention. Computer system 40 includes a controller 42 and a RAM 44. Controller 42 is electrically coupled to RAM 44 via memory communications path 46 and data communications path 48. Controller 42 provides row and column addresses and control signals to RAM 44 via memory communications path 46. Controller 42 provides data signals to RAM 44 and receives data signals from RAM 44 via data communications path 48. RAM 44 can be any suitable type of RAM, such as a DRAM, a DDR-SDRAM, a GDDR-SDRAM, an RLDRAM, or a PSRAM. In one embodiment, RAM 44 is a DRAM, such as a fourth generation DDR SDRAM (DDR4 SDRAM), a third generation GDDR SDRAM (GDDR3 SDRAM), a fourth generation GDDR SDRAM (GDDR4 SDRAM), or a later generation of DRAM.

RAM 44 includes an array of memory cells 50, a row address latch and decoder 52, a column address latch and decoder 54, a sense amplifier circuit 56, a RAM I/O circuit 58, a control circuit 60, and an address register 62. Conductive word lines 64, referred to as row select lines, extend in the x-direction across the array of memory cells 50. Conductive bit lines 66, referred to as digit lines, extend in the y-direction across the array of memory cells 50. A memory cell 68 is located at each cross point of a word line 64 and a bit line 66.

Each word line 64 is electrically coupled to row address latch and decoder 52 and each bit line 66 is electrically coupled to one of the primary sense amplifiers in sense amplifier circuit 56. The sense amplifier circuit 56 is electrically coupled to column address latch and decoder 54 via conductive column select lines 70. Also, sense amplifier circuit 56 is electrically coupled to row address latch and decoder 52 via communications path 72 and to RAM I/O circuit 58 via I/O communications path 74. RAM I/O circuit 58 is electrically coupled to controller 42 via data communications path 48. Data signals are transferred between RAM I/O circuit 58 and controller 42 via data communications path 48.

Controller 42 is electrically coupled to RAM I/O circuit 58 via data communications path 48 and to control circuit 60 and address register 62 via memory communications path 46. Control circuit 60 is electrically coupled to row address latch and decoder 52 and column address latch and decoder 54 via control communications path 76. Address register 62 is electrically coupled to row address latch and decoder 52 and column address latch and decoder 54 via row and column address lines 78.

Address register 62 receives row and column addresses from controller 42 via memory communications path 46. Address register 62 supplies a row address to row address latch and decoder 52 via row and column address lines 78, and control circuit 60 supplies a RAS signal to row address latch and decoder 52 via control communications path 76 to latch the supplied row address into row address latch and decoder 52. Address register 62 supplies a column address to column address latch and decoder 54 via row and column address lines 78, and control circuit 60 supplies a CAS signal to column address latch and decoder 54 via control communications path 76 to latch the supplied column address into column address latch and decoder 54.

Row address latch and decoder 52 receives row addresses and RAS signals and latches the row addresses into row address latch and decoder 52. Row address latch and decoder 52 decodes each of the row addresses to select a row of memory cells 68. In addition, row address latch and decoder 52 provides sense amplifier activation signals and equalization and precharge signals to sense amplifier circuit 56 via communications path 72.

Column address latch and decoder 54 activates column select lines 70 to connect primary sense amplifiers in sense amplifier circuit 56 to RAM I/O circuit 58. Column address latch and decoder 54 receives a column address and latches the column address into column address latch and decoder 54. Column address latch and decoder 54 decodes the column address to select addressed column select lines 70. In addition, column address latch and decoder 54 receives column select line activation signals from control circuit 60 via control communications path 76. The column select line activation signals indicate which of the addressed column select lines 70 are to be activated by column address latch and decoder 54. Column address latch and decoder 54 activates column select lines 70 that are addressed by the column address and selected for activation by the column select line activation signals. Activated column select lines 70 are provided to sense amplifier circuit 56 to connect primary sense amplifiers in sense amplifier circuit 56 to RAM I/O circuit 58.

Control circuit 60 receives addresses and control signals from controller 42 via memory communications path 46. Controller 42 provides control signals, such as read/write enable, RAS, and CAS signals to control circuit 60. Control circuit 60 provides RAS signals to row address latch and decoder 52 and CAS signals to column address latch and decoder 54. Also, control circuit 60 provides control signals to column address latch and decoder 52 to selectively activate column select lines 70.

Controller 42 and RAM I/O circuit 58 communicate data signals between controller 42 and RAM 44 via data communications path 48. Controller 42 and RAM 44 are similar to chip 22 and chip 24 (shown in FIG. 1). RAM I/O circuit 58 includes a suitable number of transmitter and receiver pairs and controller 42 includes a suitable number of transmitter and receiver pairs. Each transmitter and receiver pair in RAM I/O circuit 58 corresponds to a transmitter and receiver pair in controller 42. Data communications path 48 includes one or more signal pathways and each transmitter and receiver pair in I/O circuit 58 is electrically coupled to the corresponding transmitter and receiver pair in controller 42 via at least one of the signal pathways in data communications path 48.

Sense amplifier circuit 56 includes primary sense amplifiers, equalization and precharge circuits, and switches. The primary sense amplifiers are differential input sense amplifiers. Each differential input of a primary sense amplifier receives a signal on a bit line 66. The equalization and precharge circuits equalize the voltage on two bit lines 66 connected to the same primary sense amplifier prior to a read or write operation. In operation, one of the differential inputs receives a data bit value from a selected memory cell 68 on one bit line 66 and the other differential input receives a reference value on the other bit line 66.

To write a data bit, one of the transmitter and receiver pairs in controller 42 provides a data bit signal to the corresponding transmitter and receiver pair in RAM I/O circuit 58 via data communications path 48. A receiver in RAM I/O circuit 58 receives the data bit signal and provides a received data bit signal to a primary sense amplifier in sense amplifier circuit 56 via I/O communications path 74. RAM I/O circuit 58 overdrives the primary sense amplifier to drive the data bit value onto the bit line 66 that is connected to one of the memory cells 68. Also, RAM I/O circuit 58 overdrives the inverse of the data bit value onto the reference bit line 66. The primary sense amplifier writes the received data bit value into the selected memory cell 68. To read a data bit value from a selected memory cell 68, a primary sense amplifier amplifies the difference between the data bit value and the reference value and provides the sensed data bit value to RAM I/O circuit 58 via I/O communications path 74.

RAM I/O circuit 58 includes an output circuit 80 that receives a data input signal DIN at 82, an inverted data input signal bDIN at 84, and an enable signal EN at 86. Data input signal DIN at 82 and inverted data input signal bDIN at 84 are received from a primary sense amplifier in sense amplifier circuit 56 via I/O communications path 74. Data input signal DIN at 82 and inverted data input signal bDIN at 84 indicate the high or low logic level of the data bit value from a selected memory cell 68 in the array of memory cells 50. Enable signal EN at 86 is received from sense amplifier circuit 56 via I/O communications path 74 to activate output circuit 80. Output circuit 80 is similar to output circuit 28 (shown in FIG. 1).

Output circuit 80 includes a secondary sense amplifier that receives data input signal DIN at 82 and inverted data input signal bDIN at 84. The secondary sense amplifier includes two receivers that can differentiate between data input signal DIN at 82 and inverted data input signal bDIN at 84. One of the two receivers is configured to switch data output signal DOUT at 88 to a low logic level based on data input signal DIN at 82 and inverted data input signal bDIN at 84. The other of the two receivers is configured to switch data output signal DOUT at 88 to a high logic level based on data input signal DIN at 82 and inverted data input signal bDIN at 84. Output circuit 80 uses enable signal EN at 86 and data output signal DOUT at 88 to enable or activate one of the two receivers in output circuit 80. The activated receiver can switch data output signal DOUT at 88 from its present logic level to the other logic level. The other one of the two receivers is disabled or turned off to reduce current consumption. Data output signal DOUT at 88 is provided to one of the transmitter and receiver pairs in RAM I/O circuit 58, which provides the sensed data bit value to the corresponding transmitter and receiver pair in controller 42 via data communications path 48.

Enabling one of the two receivers and disabling the other one of the two receivers reduces the amount of current consumed by the secondary sense amplifier and output circuit 80. Voltage drops along power supply lines are reduced, which increases reliability. Also, each of the two receivers can be built to consume more current to increase the speed of output circuit 80 without exceeding power resources. Reliable and higher bandwidth communications between controller 42 and RAM 44 can be maintained using increased data bit speeds and an increased number of output circuits, such as output circuit 80, in parallel.

In one embodiment, output circuit 80 includes recharge circuitry that recharges data output signal DOUT at 88. In one embodiment, output circuit 80 includes bias circuitry that biases one of the input signals, data input signal DIN at 82 or inverted data input signal bDIN at 84, to a voltage level that increases the sensitivity of the activated receiver. In one embodiment, RAM 44 includes any suitable number of output circuits, such as output circuit 80, and RAM 44 outputs any suitable number of data output signals, such as data output signal DOUT at 88, to controller 42 via data communications path 48.

During a write operation, control circuit 60 receives write control signals and address register 62 receives the row address of a selected memory cell or cells 68. The row address is supplied from address register 62 to row address latch and decoder 52 and latched into row address latch and decoder 52 by control circuit 60 and a RAS signal. The row address latch and decoder 52 decodes the row address and activates the selected word line 64. As the selected word line 64 is activated, the value stored in each memory cell 68 coupled to the selected word line 64 is passed to the respective bit line 66 and the primary sense amplifier that is electrically coupled to the respective bit line 66.

Data to be stored in the array of memory cells 50 is supplied from transmitter and receiver pairs in controller 42 to transmitter and receiver pairs in I/O circuit 58 via data communications path 48. Receivers in RAM I/O circuit 58 receive the data signals and provide received data signals to sense amplifier circuit 56.

Control circuit 60 and address register 62 receive the column address of the selected memory cell or cells 68. Address register 62 supplies the column address to column address latch and decoder 54 and the column address is latched into column address latch and decoder 54 by control circuit 60 and a CAS signal. Column address latch and decoder 54 receives column select line activation signals from control circuit 60 and activates selected column select lines 70 to connect primary sense amplifiers in sense amplifier circuit 56 to RAM I/O circuit 58. RAM I/O circuit 58 provides the data signals to the primary sense amplifiers in sense amplifier circuit 56 via I/O communications path 74. RAM I/O circuit 58 overdrives the primary sense amplifiers to write data to the selected memory cell or cells 68 via bit lines 66.

During a read operation, control circuit 60 receives read control signals and address register 62 receives the row address of a selected memory cell or cells 68. The row address is supplied from address register 62 to row address latch and decoder 52 and latched into row address latch and decoder 52 by control circuit 60 and a RAS signal. Row address latch and decoder 52 decodes the row address and activates the selected word line 64. As the selected word line 64 is activated, the value stored in each memory cell 68 coupled to the selected word line 64 is passed to the respective bit line 66. The data bit value stored at a memory cell 68 is detected by a primary sense amplifier that is electrically coupled to the respective bit line 66.

Next, control circuit 60 and address register 62 receive the column address of the selected memory cell or cells 68. The column address is supplied from address register 62 to column address latch and decoder 54 and latched into column address latch and decoder 54 by control circuit 60 and a CAS signal. The column address latch and decoder 54 decodes the column address to select column select lines 70. Control circuit 60 provides control signals to column address latch and decoder 54 to selectively activate column select lines 70 and connect selected primary sense amplifiers to RAM I/O circuit 58.

Output circuit 80 receives data input signal DIN at 82 and inverted data input signal bDIN at 84 from a primary sense amplifier in sense amplifier circuit 56 via I/O communications path 74. Also, output circuit 80 receives enable signal EN at 86 from sense amplifier circuit 56 via I/O communications path 74. Output circuit 80 activates one of the two receivers in output circuit 80 via enable signal EN at 86 and data output signal DOUT at 88. The activated receiver either switches data output signal DOUT at 88 from its present logic level to the other logic level or the activated receiver leaves data output signal DOUT at 88 at its present logic level, depending on data input signal DIN at 82 and inverted data input signal bDIN at 84. The other one of the two receivers is disabled or turned off to reduce current consumption. The resulting data output signal DOUT at 88 is provided to one of the transmitter and receiver pairs in RAM I/O circuit 58, which provides the sensed data bit value to the corresponding transmitter and receiver pair in controller 42 via data communications path 48.

Figure 3:
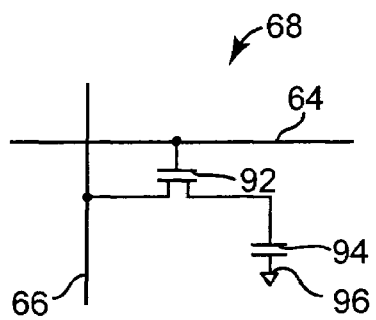
FIG. 3 is a diagram illustrating one embodiment of a memory cell in an array of memory cells.

FIG. 3 is a diagram illustrating one embodiment of a memory cell 68 in the array of memory cells 50. Memory cell 68 includes a transistor 92 and a capacitor 94. The gate of transistor 92 is electrically coupled to a word line 64. One side of the drain-source path of transistor 92 is electrically coupled to a bit line 66 and the other side of the drain-source path is electrically coupled to one side of capacitor 94. The other side of capacitor 94 is electrically coupled to a reference 96, such as one-half the supply voltage. Capacitor 94 is charged and discharged to represent a logic 0 or a logic 1.

During a read operation, word line 64 is activated to turn on transistor 92 and the value stored on capacitor 94 is read by a primary sense amplifier via bit line 66. During a write operation, word line 64 is activated to turn on transistor 92 to access capacitor 94. The primary sense amplifier connected to bit line 66 is overdriven to write a data value onto capacitor 94 via bit line 66 and transistor 92.

A read operation on memory cell 68 is a destructive read operation. After each read operation, capacitor 94 is recharged or discharged to the data value that was just read. In addition, even without a read operation, the charge on capacitor 94 discharges over time. To retain a stored value, memory cell 68 is refreshed periodically by reading and/or writing memory cell 68. All memory cells 68 in the array of memory cells 50 are periodically refreshed to maintain their values.

Figure 4:
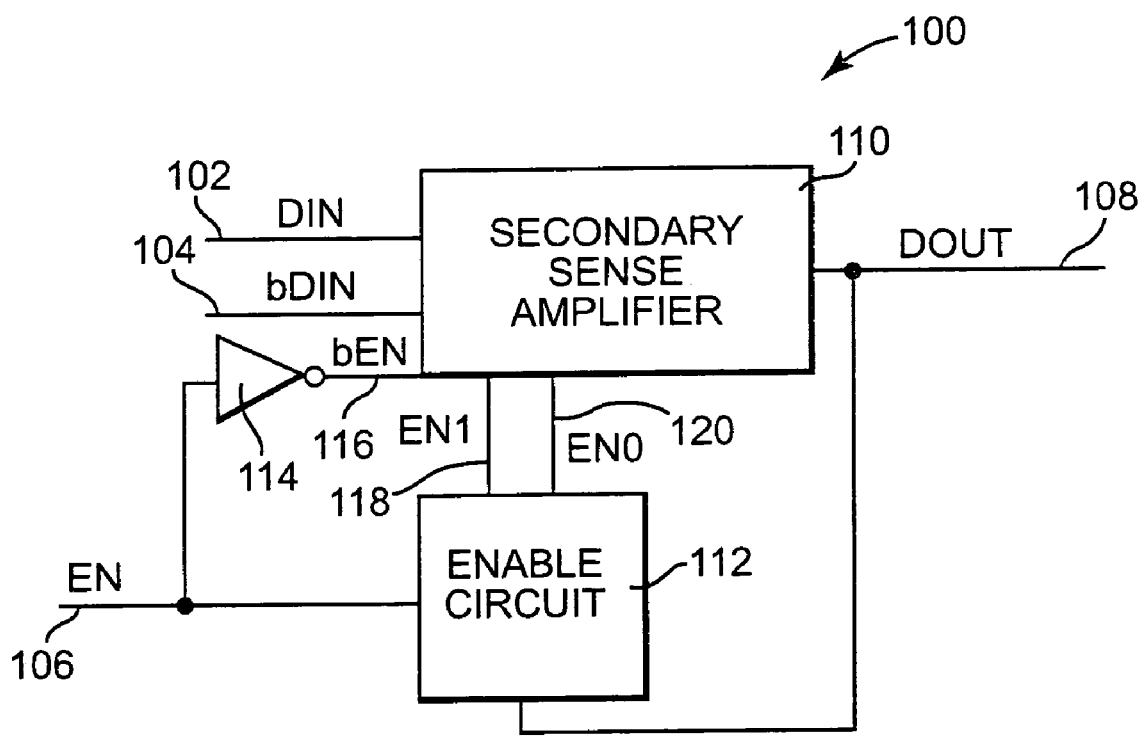
FIG. 4 is a diagram illustrating one embodiment of an output circuit.

FIG. 4 is a diagram illustrating one embodiment of an output circuit 100. Output circuit 100 receives a data input signal DIN at 102, an inverted data input signal bDIN at 104, and an enable signal EN at 106 and provides a data output signal DOUT at 108. Data input signal DIN at 102 and inverted data input signal bDIN at 104 indicate data bit signal values, such as high logic levels (i.e., ones) and low logic levels (i.e., zeroes). Data output signal DOUT at 108 is updated or changed as needed to provide data output signal values that correspond to the data bit signal values indicated via received data input signal DIN at 102 and inverted data input signal bDIN at 104. Output circuit 100 is similar to output circuit 28 (shown in FIG. 1) and output circuit 80 (shown in FIG. 2). In one embodiment, data input signal DIN at 102 and inverted data input signal bDIN at 104 are received from a primary sense amplifier in a RAM and data input signal DIN at 102 and inverted data input signal bDIN at 104 indicate the logic level of a data bit from a memory cell in the RAM.

Output circuit 100 includes a secondary sense amplifier 110, an enable circuit 112, and an inverter 114. Secondary sense amplifier 110 is electrically coupled to inverter 114 via inverter communications path 116 and to enable circuit 112 via enable one communications path 118 and enable zero communications path 120. Inverter 114 receives enable signal EN at 106 and provides an inverted enable signal bEN at 116.

Enable circuit 112 receives enable signal EN at 106 and data output signal DOUT at 108 and provides enable one signal EN1 at 118 and enable zero signal EN0 at 120. If enable signal EN at 106 is active, enable circuit 112 provides one active enable signal in the enable signals of enable one signal EN1 at 118 and enable zero signal EN0 at 120 and one inactive enable signal in the enable signals of enable one signal EN1 at 118 and enable zero signal EN0 at 120. If enable signal EN at 106 is inactive, enable circuit 112 provides inactive enable signals in enable one signal EN1 at 118 and enable zero signal EN0 at 120.

Enable circuit 112 provides active and inactive enable signals based on data output signal DOUT at 108. If data output signal DOUT at 108 is a low logic level (i.e., a zero), enable circuit 112 provides an active enable one signal EN1 at 118 and an inactive enable zero signal EN0 at 120. If data output signal DOUT at 108 is a high logic level (i.e., a one), enable circuit 112 provides an active enable zero signal EN0 at 120 and an inactive enable one signal EN1 at 118.

Secondary sense amplifier 110 receives data input signal DIN at 102 and inverted data input signal bDIN at 104 and includes two receivers configured to differentiate between data input signal DIN at 102 and inverted data input signal bDIN at 104. One of the two receivers is configured to switch data output signal DOUT at 108 to a high logic level if the data bit signal value indicated via data input signal DIN at 102 and inverted data input signal bDIN at 104 is a high logic level and to leave data output signal DOUT at 108 at a low logic level if the data bit signal value indicated via data input signal DIN at 102 and inverted data input signal bDIN at 104 is a low logic level. The other one of the two receivers is configured to switch data output signal DOUT at 108 to a low logic level if the data bit signal value indicated via data input signal DIN at 102 and inverted data input signal bDIN at 104 is a low logic level and to leave data output signal DOUT at 108 at a high logic level if the data bit signal value indicated via data input signal DIN at 102 and inverted data input signal bDIN at 104 is a high logic level.

Secondary sense amplifier 110 receives inverted enable signal bEN at 116. Secondary sense amplifier 110 activates internal circuitry via an active inverted enable signal bEN at 116 to update data output signal DOUT at 108. Secondary sense amplifier 110 deactivates the internal circuitry via an inactive inverted enable signal bEN at 116 to latch in data output signal DOUT at 108.

Secondary sense amplifier 110 receives enable one signal EN1 at 118 and enable zero signal EN0 at 120 and activates receivers based on the enable one signal EN1 at 118 and the enable zero signal EN0 at 120. If enable signal EN at 106 is inactive, enable circuit 112 provides inactive enable signals in enable one signal EN1 at 118 and enable zero signal EN0 at 120 and secondary sense amplifier 110 deactivates the two receivers. Also, in this situation, inverted enable signal bEN at 116 is inactive and the internal circuitry is deactivated via inverted enable signal bEN at 116 to latch in data output signal DOUT at 108.

If enable signal EN at 106 is active, enable circuit 112 provides one active enable signal and one inactive enable signal in enable one signal EN1 at 118 and enable zero signal EN0 at 120 and secondary sense amplifier 110 activates one of the receivers and deactivates the other one of the receivers. If enable one signal EN1 at 118 is active and enable zero signal EN0 at 120 is inactive, secondary sense amplifier 110 activates the one of the two receivers configured to switch data output signal DOUT at 108 to a high logic level if the data bit signal value indicated via data input signal DIN at 102 and inverted data input signal bDIN at 104 is a high logic level. The other receiver is disabled or deactivated via the inactive enable zero signal EN0 at 120. If enable zero signal EN0 is active and enable one signal EN1 at 118 is inactive, secondary sense amplifier 110 activates the one of the two receivers that is configured to switch data output signal DOUT at 108 to a low logic level if the data bit signal value indicated via data input signal DIN at 102 and inverted data input signal bDIN at 104 is a low logic level. The other receiver is deactivated via the inactive enable one signal EN1 at 118. Also, in this situation, inverted enable signal bEN at 116 is active and the internal circuitry is activated via inverted enable signal bEN at 116 to update data output signal DOUT at 108.

The activated receiver can switch data output signal DOUT at 108 from its present logic level to the other logic level. The other one of the two receivers is disabled or turned off to reduce current consumption. Data output signal DOUT at 108 provides the data bit value indicated via data input signal DIN at 102 and inverted data input signal bDIN at 104.

In one example operation, secondary sense amplifier 110 provides a low logic level in data output signal DOUT at 108, which is fed back to enable circuit 112. Enable signal EN at 106 is activated and inverted enable signal bEN at 116 is activated. Enable circuit 112 receives the low logic level in data output signal DOUT at 108 and provides an active enable one signal EN1 at 118 and an inactive enable zero signal EN0 at 120. Secondary sense amplifier 110 receives the active enable one signal EN1 at 118 and the inactive enable zero signal EN0 at 120 and activates the one of the two receivers configured to switch data output signal DOUT at 108 to a high logic level if the data bit signal value indicated via data input signal DIN at 102 and inverted data input signal bDIN at 104 is a high logic level. The other receiver is disabled or inactivated via the inactive enable zero signal EN0 at 120.

Secondary sense amplifier 110 receives data input signal DIN at 102 and inverted data input signal bDIN at 104, which indicate data bit values. If data input signal DIN at 102 and inverted data input signal bDIN at 104 indicate a high logic level, the activated receiver and secondary sense amplifier 110 switch data output signal DOUT at 108 to a high logic level. If data input signal DIN at 102 and inverted data input signal bDIN at 104 indicate a low logic level, the activated receiver and secondary sense amplifier 110 leave data output signal DOUT at 108 at the low logic level. Data output signal DOUT at 108 provides the data bit value indicated via data input signal DIN at 102 and inverted data input signal bDIN at 104.

In another example operation, secondary sense amplifier 110 provides a high logic level in data output signal DOUT at 108, which is fed back to enable circuit 112. Enable signal EN at 106 is activated and inverted enable signal bEN at 116 is activated. Enable circuit 112 receives the high logic level in data output signal DOUT at 108 and provides an active enable zero signal EN0 at 120 and an inactive enable one signal EN1 at 118. Secondary sense amplifier 110 receives the active enable zero signal EN0 at 120 and the inactive enable one signal EN1 at 118 and activates the one of the two receivers configured to switch data output signal DOUT at 108 to a low logic level if the data bit signal value indicated via data input signal DIN at 102 and inverted data input signal bDIN at 104 is a low logic level. The other receiver is disabled or inactivated via the inactive enable one signal EN1 at 118.

Secondary sense amplifier 110 receives data input signal DIN at 102 and inverted data input signal bDIN at 104, which indicate data bit values. If data input signal DIN at 102 and inverted data input signal bDIN at 104 indicate a low logic level, the activated receiver and secondary sense amplifier 110 switch data output signal DOUT at 108 to a low logic level. If data input signal DIN at 102 and inverted data input signal bDIN at 104 indicate a high logic level, the activated receiver and secondary sense amplifier 110 leave data output signal DOUT at 108 at the high logic level. Data output signal DOUT at 108 provides the data bit value indicated via data input signal DIN at 102 and inverted data input signal bDIN at 104.

Figure 5:
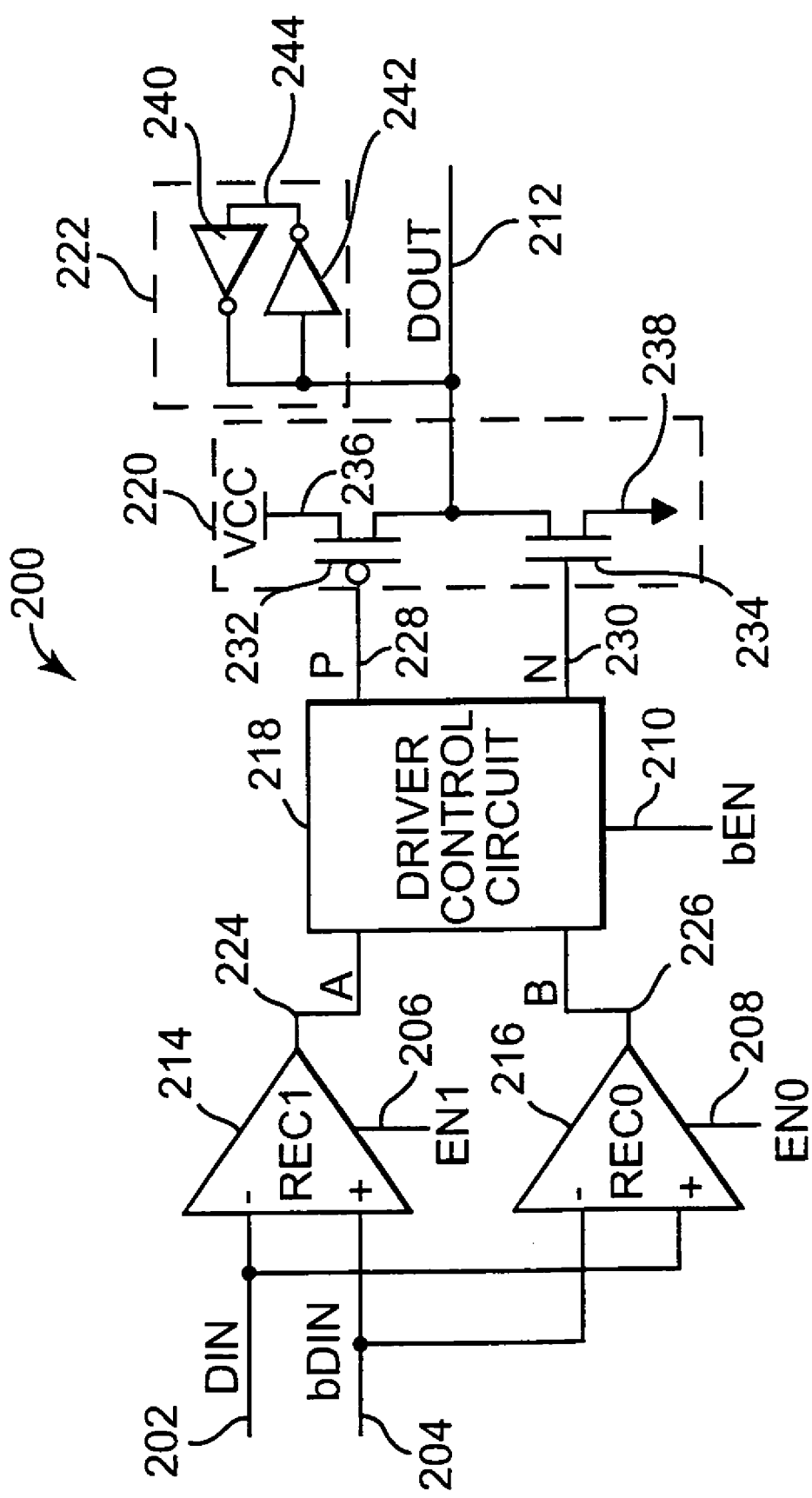
FIG. 5 is a diagram illustrating one embodiment of a secondary sense amplifier.

FIG. 5 is a diagram illustrating one embodiment of a secondary sense amplifier 200. Secondary sense amplifier 200 is similar to secondary sense amplifier 110 (shown in FIG. 4). Secondary sense amplifier 200 receives data input signal DIN at 202, inverted data input signal bDIN at 204, enable one signal EN1 at 206, enable zero signal EN0 at 208, and inverted enable signal bEN at 210. Secondary sense amplifier 200 provides data output signal, DOUT at 212.

Secondary sense amplifier 200 includes a receiver one at 214, a receiver zero at 216, a driver control circuit 218, a driver circuit 220, and a latch circuit 222. The output of receiver one 214 is electrically coupled to driver control circuit 218 via communications path 224. Receiver one 214 receives data input signal DIN at 202, inverted data input signal bDIN at 204, and enable one signal EN1 at 206 and provides output signal A at 224 to driver control circuit 218. The output of receiver zero 216 is electrically coupled to driver control circuit 218 via communications path 226. Receiver zero 216 receives data input signal DIN at 202, inverted data input signal bDIN at 204, and enable zero signal EN0 at 208 and provides output signal B at 226 to driver control circuit 218.

Driver control circuit 218 is electrically coupled to driver circuit 220 via communications path 228 and communications path 230. Driver control circuit 218 receives output signal A at 224, output signal B at 226, and inverted enable signal bEN at 210. Driver control circuit 218 provides output signal P at 228 and output signal N at 230 to driver circuit 220 that is electrically coupled to latch circuit 222 via communications path 212. Driver circuit 220 provides data output signal DOUT at 212 to latch circuit 222.

Driver circuit 220 includes a p-channel metal oxide semiconductor (PMOS) transistor 232 and an n-channel metal oxide semiconductor (NMOS) transistor 234. The gate of PMOS transistor 232 is electrically coupled to driver control circuit 218 via communications path 228. The gate of NMOS transistor 234 is electrically coupled to driver control circuit 218 via communications path 230. One side of the drain-source path of PMOS transistor 232 is electrically coupled to a power supply voltage, such as VCC, at 236. The other side of the drain-source path of PMOS transistor 232 is electrically coupled to one side of the drain-source path of NMOS transistor 234 and latch circuit 222 via communications path 212. The other side of the drain-source path of NMOS transistor 234 is electrically coupled to a reference, such as ground, at 238.

Latch circuit 222 includes a first inverter 240 and a second inverter 242. The input of first inverter 240 is electrically coupled to the output of second inverter 242 via inverter communications path 244. The output of first inverter 240 is electrically coupled to the input of second inverter 242 and to the drain-source paths of PMOS transistor 232 and NMOS transistor 234 via communications path 212.

Data input signal DIN at 202 and inverted data input signal bDIN at 204 indicate data bit signal values, such as high logic levels (i.e., ones) and low logic levels (i.e., zeroes). Data output signal DOUT at 212 is updated or changed as needed to provide data output signal values that correspond to the data bit signal values indicated via received data input signal DIN at 202 and inverted data input signal bDIN at 204. A data bit signal value is indicated via the difference between data input signal DIN at 202 and inverted data input signal bDIN at 204, which can be very small. In one embodiment, data input signal DIN at 202 and inverted data input signal bDIN at 204 are equalized between successive data bit signal values. In one embodiment, data input signal DIN at 202 and inverted data input signal bDIN at 204 are received from a primary sense amplifier in a RAM and data input signal DIN at 202 and inverted data input signal bDIN at 204 indicate the logic level of a data bit from a memory cell in the RAM.

Receiver one 214 includes a differential amplifier that differentiates between data input signal DIN at 202 and inverted data input signal bDIN at 204 to provide output signal A at 224. The negative input of receiver one 214 receives data input signal DIN at 202 and the positive input of receiver one 214 receives inverted data input signal bDIN at 204. The enable input of receiver one 214 receives enable one signal EN1 at 206. Receiver one is activated or turned on via an active enable one signal EN1 at 206 and deactivated or turned off via an inactive enable one signal EN1 at 206. If receiver one 214 is activated via enable one signal EN1 at 206, receiver one 214 differentiates between data input signal DIN at 202 and inverted data input signal bDIN at 204 to provide a high or low voltage level in output signal A at 224. If data input signal DIN at 202 is greater than inverted data input signal bDIN at 204, receiver one 214 provides a low voltage level in output signal A at 224. If data input signal DIN at 202 is less than inverted data input signal bDIN at 204, receiver one 214 provides a high voltage level in output signal A at 224. If receiver one 214 is deactivated via enable one signal EN1 at 206, receiver one 214 provides a high voltage level in output signal A at 224.

Receiver zero 216 includes a differential amplifier that differentiates between data input signal DIN at 202 and inverted data input signal bDIN at 204 to provide output signal B at 226. The positive input of receiver zero 216 receives data input signal DIN at 202 and the negative input of receiver zero 216 receives inverted data input signal bDIN at 204. The enable input of receiver zero 216 receives enable zero signal EN0 at 208. Receiver zero is activated or turned on via an active enable zero signal EN0 at 208 and deactivated or turned off via an inactive enable zero signal EN0 at 208. If receiver zero 216 is activated via enable zero signal EN0 at 208, receiver zero 216 differentiates between data input signal DIN at 202 and inverted data input signal bDIN at 204 to provide a high or low voltage level in output signal B at 226. If data input signal DIN at 202 is greater than inverted data input signal bDIN at 204, receiver zero 216 provides a high voltage level in output signal B at 226. If data input signal DIN at 202 is less than inverted data input signal bDIN at 204, receiver zero 216 provides a low voltage level in output signal B at 226. If receiver zero 216 is deactivated via enable zero signal EN0 at 208, receiver zero 216 provides a high voltage level in output signal B at 226.

A low voltage level in output signal A at 224 indicates that data input signal DIN at 202 is greater than inverted data input signal bDIN at 204 and a low voltage level in output signal B at 226 indicates that data input signal DIN at 202 is less than inverted data input signal bDIN at 204. In one embodiment, a low voltage level in output signal A at 224 indicates a high logic level data bit signal value and a low voltage level in output signal B at 226 indicates a low logic level data bit signal value.

Driver control circuit 218 receives output signal A at 224, output signal B at 226, and inverted enable signal bEN at 210 and provides output signal P at 228 and output signal N at 230. Driver control circuit 218 is activated via an active inverted enable signal bEN at 210 and deactivated via an inactive inverted enable signal bEN at 210. If driver control circuit 218 is activated, drive control circuit 218 provides output signal P at 228 and output signal N at 230 based on output signal A at 224 and output signal B at 226. If output signal A at 224 is at a low voltage level and output signal B at 226 is at a high voltage level, driver control circuit 218 provides a low voltage level output signal P at 228 and a low voltage level output signal N at 230. The low voltage level output signal P at 228 turns on PMOS transistor 232 and the low voltage level output signal N at 230 turns off NMOS transistor 234 to provide a high logic level data output signal DOUT at 212. If output signal A at 224 is at a high voltage level and output signal B at 226 is at a low voltage level, driver control circuit 218 provides a high voltage level output signal P at 228 and a high voltage level output signal N at 230. The high voltage level output signal P at 228 turns off PMOS transistor 232 and the high voltage level output signal N at 230 turns on NMOS transistor 234 to provide a low logic level data output signal DOUT at 212. If output signal A at 224 is at a high voltage level and output signal B at 226 is at a high voltage level, driver control circuit 218 provides a high voltage level output signal P at 228 that turns off PMOS transistor 232 and a low voltage level output signal N at 230 that turns off NMOS transistor 234. Also, if driver control circuit 218 is deactivated, driver control circuit 218 provides a high voltage level output signal P at 228 that turns off PMOS transistor 232 and a low voltage level output signal N at 230 that turns off NMOS transistor 234. Turning off PMOS transistor 232 and NMOS transistor 234 provides a high impedance output on communications path 212 and data output signal DOUT at 212 is not changed via driver circuit 220.

Latch circuit 222 latches in data output signal DOUT at 212. Inverter 242 inverts data output signal DOUT at 212 to provide an inverted data output signal at 244 and inverter 240 inverts the inverted data output signal at 244 to provide data output signal DOUT at 212.

In one example operation, secondary sense amplifier 200 is enabled to update and to be able to change data output signal DOUT at 212 from a low logic level (i.e., a zero) to a high logic level (i.e., a one). Receiver one 214 is activated via an active enable one signal EN1 at 206 and receiver zero 216 is deactivated via an inactive enable zero signal EN0 at 208. The deactivated receiver zero 216 provides a high voltage level in output signal B at 226 to driver control circuit 218. Receiver one 214 differentiates between data input signal DIN at 202 and inverted data input signal bDIN at 204 to provide a high or low voltage level in output signal A at 224. If data input signal DIN at 202 is greater than inverted data input signal bDIN at 204, receiver one 214 provides a low voltage level in output signal A at 224. If data input signal DIN at 202 is less than inverted data input signal bDIN at 204, receiver one 214 provides a high voltage level in output signal A at 224.

Driver control circuit 218 is activated via an active inverted enable signal bEN at 210. Driver control circuit 218 receives the high voltage level in output signal B at 226 and provides output signal P at 228 and output signal N at 230 based on output signal A at 224. If output signal A at 224 is at a low voltage level, indicating data input signal DIN at 202 is greater than inverted data input signal bDIN at 204, driver control circuit 218 provides a low voltage level output signal P at 228 and a low voltage level output signal N at 230. The low voltage level output signal P at 228 turns on PMOS transistor 232 and the low voltage level output signal N at 230 turns off NMOS transistor 234 to provide a high logic level data output signal DOUT at 212. If output signal A at 224 is at a high voltage level, indicating data input signal DIN at 202 is less than inverted data input signal bDIN at 204, driver control circuit 218 provides a high voltage level output signal P at 228 that turns off PMOS transistor 232 and a low voltage level output signal N at 230 that turns off NMOS transistor 234. Turning off PMOS transistor 232 and NMOS transistor 234 provides a high impedance output on communications path 212 and data output signal DOUT at 212 remains at a low logic level. The updated data output signal DOUT at 212 is latched in via latch circuit 222.

In another example operation, secondary sense amplifier 200 is enabled to update and to be able to change data output signal DOUT at 212 from a high logic level to a low logic level. Receiver one 214 is deactivated via an inactive enable one signal EN1 at 206 and receiver zero 216 is activated via an active enable zero signal EN0 at 208. The deactivated receiver one 214 provides a high voltage level in output signal A at 224 to driver control circuit 218. Receiver zero 216 differentiates between data input signal DIN at 202 and inverted data input signal bDIN at 204 to provide a high or low voltage level in output signal B at 226. If data input signal DIN at 202 is greater than inverted data input signal bDIN at 204, receiver zero 216 provides a high voltage level in output signal B at 226. If data input signal DIN at 202 is less than inverted data input signal bDIN at 204, receiver zero 216 provides a low voltage level in output signal B at 226.

Driver control circuit 218 is activated via an active inverted enable signal bEN at 210. Driver control circuit 218 receives the high voltage level in output signal A at 224 and provides output signal P at 228 and output signal N at 230 based on output signal B at 226. If output signal B at 226 is at a low voltage level, indicating data input signal DIN at 202 is less than inverted data input signal bDIN at 204, driver control circuit 218 provides a high voltage level output signal P at 228 and a high voltage level output signal N at 230. The high voltage level output signal P at 228 turns off PMOS transistor 232 and the high voltage level output signal N at 230 turns on NMOS transistor 234 to provide a low logic level data output signal DOUT at 212. If output signal B at 226 is at a high voltage level, indicating data input signal DIN at 202 is greater than inverted data input signal bDIN at 204, driver control circuit 218 provides a high voltage level output signal P at 228 that turns off PMOS transistor 232 and a low voltage level output signal N at 230 that turns off NMOS transistor 234. Turning off PMOS transistor 232 and NMOS transistor 234 provides a high impedance output on communications path 212 and data output signal DOUT at 212 remains at a high logic level. The updated data output signal DOUT at 212 is latched in via latch circuit 222.

Figure 6:
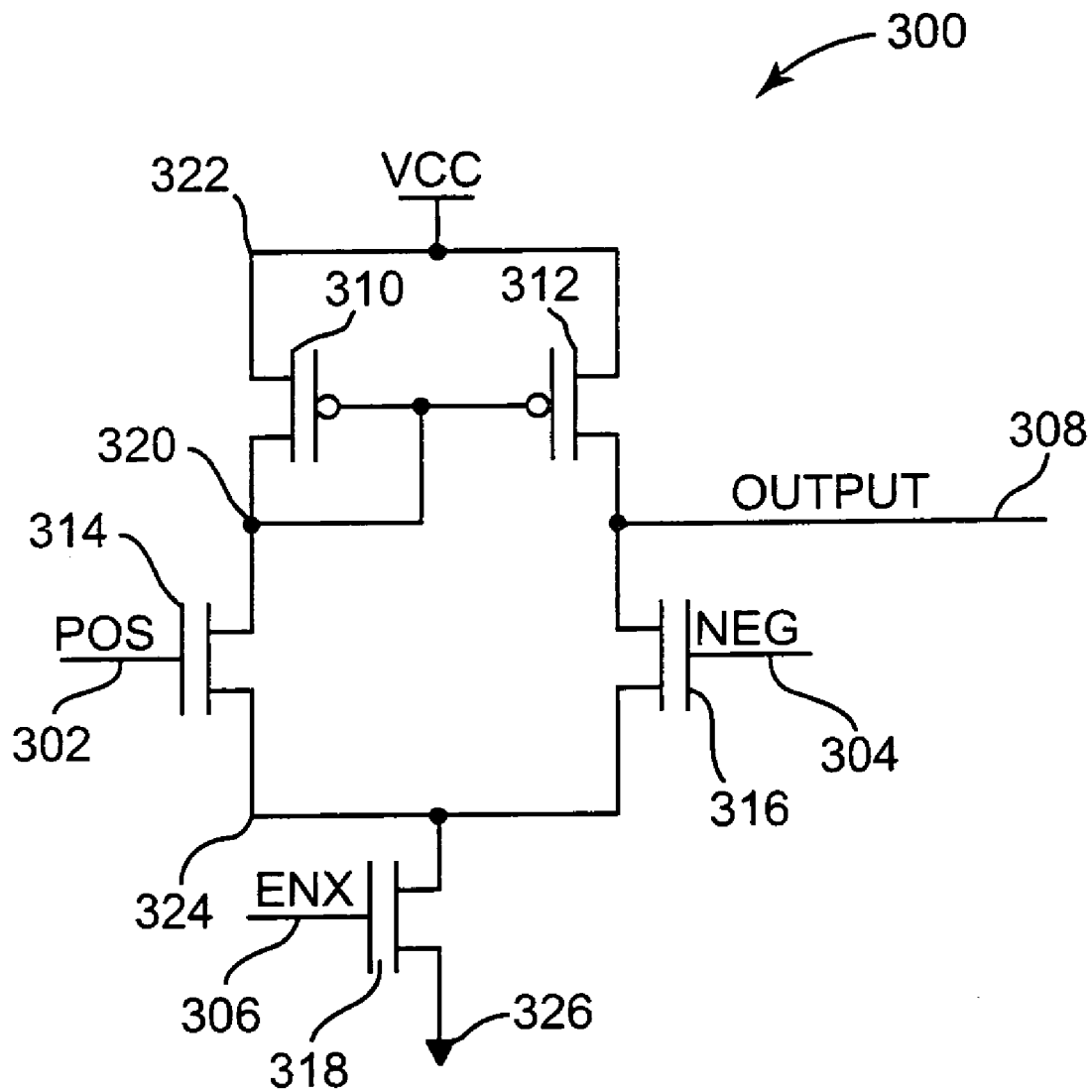
FIG. 6 is a diagram illustrating one embodiment of a differential amplifier receiver.

FIG. 6 is a diagram illustrating one embodiment of a differential amplifier receiver 300. Differential amplifier receiver 300 is similar to receiver one 214 and receiver zero 216 (shown in FIG. 5). Differential amplifier receiver 300 receives a positive input signal POS at 302, a negative input signal NEG at 304, an enable input signal ENX at 306, and provides an output signal OUTPUT at 308.

Differential amplifier receiver 300 includes a first PMOS transistor 310, a second PMOS transistor 312, a first NMOS transistor 314, a second NMOS transistor 316, and a third NMOS transistor 318. The gate of first NMOS transistor 314 receives positive input signal POS at 302 and one side of the drain-source path of first NMOS transistor 314 is electrically coupled at 320 to the gate and one side of the drain-source path of first PMOS transistor 310 and the gate of second PMOS transistor 312. The other side of the drain-source path of first PMOS transistor 310 is electrically coupled to a power supply voltage, such as VCC, at 322.

The other side of the drain-source path of first NMOS transistor 314 is electrically coupled at 324 to one side of the drain-source path of second NMOS transistor 316 and one side of the drain-source path of third NMOS transistor 318. The gate of third NMOS transistor 318 receives enable input signal ENX at 306 and the other side of the drain-source path of third NMOS transistor 318 is electrically coupled to a reference, such as ground, at 326.

The gate of second NMOS transistor 316 receives negative input signal NEG at 304 and the other side of the drain-source path of second NMOS transistor 316 is electrically coupled at 308 to one side of the drain-source path of second PMOS transistor 312. The other side of the drain-source path of second PMOS transistor 312 is electrically coupled to a power supply voltage, such as VCC, at 322.

Differential amplifier receiver 300 is turned on via an active, high voltage level, enable input signal ENX at 306 and turned off via an inactive, low voltage level, enable input signal ENX at 306. A high voltage level enable input signal ENX at 306 turns on third NMOS transistor 318 to provide a current source via the drain-source path of third NMOS transistor 318. A low voltage level enable input signal ENX at 306 turns off third NMOS transistor 318 to stop current from flowing through the drain-source path of third NMOS transistor 318 and turn off differential amplifier receiver 300.

In operation, differential amplifier receiver 300 is turned on via an active, high voltage level, enable input signal ENX at 306. If positive input signal POS at 302 is less than negative input signal NEG at 304, second NMOS transistor 316 is biased on to provide current through third NMOS transistor 318 and first NMOS transistor 314 is biased off. First PMOS transistor 310 pulls the gates of first PMOS transistor 310 and second PMOS transistor 312 to a high voltage level that biases off first PMOS transistor 310 and second PMOS transistor 312. Second NMOS transistor 316 and third NMOS transistor 318 pull output signal OUTPUT at 308 to a low voltage level.

If positive input signal POS at 302 is greater than negative input signal NEG at 304, first NMOS transistor 314 is biased on to provide current through third NMOS transistor 318 and second NMOS transistor 316 is biased off. First PMOS transistor 310 provides current from VCC to first NMOS transistor 314. The current passes through first NMOS transistor 314 and third NMOS transistor 318 to the reference at 326. First PMOS transistor 310 and second PMOS transistor 312 are coupled in a current mirror configuration and second PMOS transistor 312 is biased on to pull output signal OUTPUT at 308 to a high voltage level. Also, if differential amplifier receiver 300 is turned off via an inactive, low voltage level, enable input signal ENX at 306, output signal OUTPUT at 308 is pulled high via second PMOS transistor 312.

Figure 7:
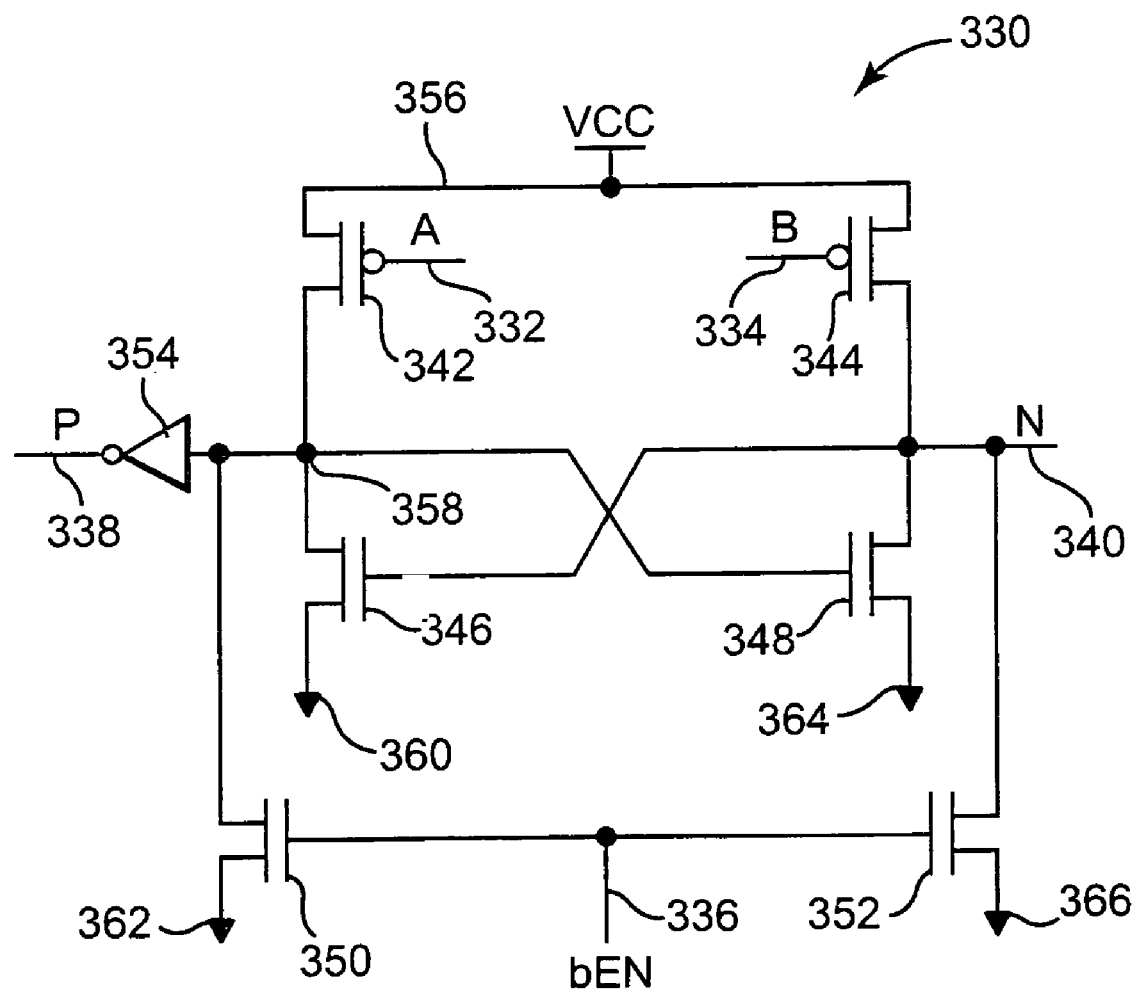
FIG. 7 is a diagram illustrating one embodiment of a driver control circuit.

FIG. 7 is a diagram illustrating one embodiment of a driver control circuit 330. Driver control circuit 330 is similar to driver control circuit 218 (shown in FIG. 5). Driver control circuit 330 receives output signal A at 332, output signal B at 334, and inverted enable signal bEN at 336. Driver control circuit 330 provides output signal P at 338 and output signal N at 340.

Driver control circuit 330 includes a first PMOS transistor 342, a second PMOS transistor 344, a first NMOS transistor 346, a second NMOS transistor 348, a third NMOS transistor 350, a fourth NMOS transistor 352, and an inverter 354. The gate of first PMOS transistor 342 receives output signal A at 332 and one side of the drain-source path of first PMOS transistor 342 is electrically coupled to a power supply voltage, such as VCC, at 356. The other side of the drain-source path of first PMOS transistor 342 is electrically coupled at 358 to the gate of second NMOS transistor 348, one side of the drain-source path of first NMOS transistor 346, one side of the drain-source path of third NMOS transistor 350, and the input of inverter 354. The other side of the drain-source path of first NMOS transistor 346 is electrically coupled to a reference, such as ground, at 360, and the other side of the drain-source path of third NMOS transistor 350 is electrically coupled to a reference, such as ground, at 362. The output of inverter 354 provides output signal P at 338.

The gate of second PMOS transistor 344 receives output signal B at 334 and one side of the drain-source path of second PMOS transistor 344 is electrically coupled to a power supply voltage, such as VCC, at 356. The other side of the drain-source path of second PMOS transistor 344 is electrically coupled at 340 to the gate of first NMOS transistor 346, one side of the drain-source path of second NMOS transistor 348, and one side of the drain-source path of fourth NMOS transistor 352 to provide output signal N at 340. The other side of the drain-source path of second NMOS transistor 348 is electrically coupled to a reference, such as ground, at 364, and the other side of the drain-source path of fourth NMOS transistor 352 is electrically coupled to a reference, such as ground, at 366. The gates of third NMOS transistor 350 and fourth NMOS transistor 352 receive inverted enable signal bEN at 336.

Driver control circuit 330 is activated via an active, low voltage level, inverted enable signal bEN at 336 and deactivated via an inactive, high voltage level, inverted enable signal bEN at 336. A low voltage level inverted enable signal bEN at 336 turns off third NMOS transistor 350 and fourth NMOS transistor 352, which enables output signal A at 332 and output signal B at 334 to change output signal P at 338 and output signal N at 340. A high voltage level inverted enable signal bEN at 336 turns on third NMOS transistor 350 and fourth NMOS transistor 352, which pulls output signal N at 340 to a low voltage level and the input of inverter 354 to a low voltage level. First NMOS transistor 346 and second NMOS transistor 348 are turned off and the output of inverter 354 provides a high voltage level output signal P at 338. In one embodiment, the high voltage level output signal P at 338 and the low voltage level output signal N at 340 control the driver circuit, such as driver circuit 220 (shown in FIG. 5), to provide a high impedance driver circuit output.

In operation, driver control circuit 330 is activated via a transition from a high voltage level to a low voltage level in inverted enable signal bEN at 336. The low voltage level inverted enable signal bEN at 336 turns off third NMOS transistor 350 and fourth NMOS transistor 352. If output signal A at 332 is at a high voltage level and output signal B at 334 is at a high voltage level, first PMOS transistor 342 is turned off and second PMOS transistor 344 is turned off. First NMOS transistor 346 and second NMOS transistor 348 remain turned off and output signal P at 338 remains at a high voltage level and output signal N at 340 remains at a low voltage level.

If output signal A at 332 transitions to a low voltage level and output signal B at 334 remains at a high voltage level, first PMOS transistor 342 is turned on and second PMOS transistor 344 is turned off. The input of inverter 354 transitions to a high voltage level and the output of inverter 354 provides a low voltage level in output signal P at 338. Also, fourth NMOS transistor 348 is turned on to hold output signal N at 340 at a low voltage level. In one embodiment, the low voltage level output signal P at 338 and the low voltage level output signal N at 340 control the driver circuit, such as driver circuit 220 (shown in FIG. 5), to provide a high voltage level driver circuit output signal.

Output signal A at 332 transitions back to a high voltage level and driver control circuit 330 is deactivated via an inactive, high voltage level, inverted enable signal bEN at 336 to provide a high voltage level output signal P at 338 and a low voltage level output signal N at 340. In one embodiment, this controls the driver circuit, such as driver circuit 220 (shown in FIG. 5), to provide a high impedance driver circuit output.

If output signal B at 334 transitions to a low voltage level and output signal A at 332 remains at a high voltage level, first PMOS transistor 342 is turned off and second PMOS transistor 344 is turned on. The output signal N at 340 transitions to a high voltage level and third NMOS transistor 346 is turned on to hold the input of inverter 354 at a low voltage level. The output of inverter 354 provides a high voltage level in output signal P at 338. In one embodiment, the high voltage level output signal P at 338 and the high voltage level output signal N at 340 control the driver circuit, such as driver circuit 220 (shown in FIG. 5), to provide a low voltage level driver circuit output signal.

Output signal B at 334 transitions back to a high voltage level and driver control circuit 330 is deactivated via an inactive, high voltage level, inverted enable signal bEN at 336 to provide a high voltage level output signal P at 338 and a low voltage level output signal N at 340. In one embodiment, this controls the driver circuit, such as driver circuit 220 (shown in FIG. 5), to provide a high impedance driver circuit output.

Figure 8:
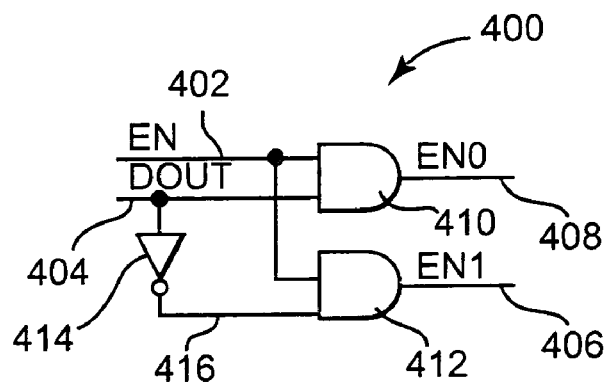
FIG. 8 is a diagram illustrating one embodiment of an enable circuit.

FIG. 8 is a diagram illustrating one embodiment of an enable circuit 400. Enable circuit 400 is similar to enable circuit 112 (shown in FIG. 4). Enable circuit 400 receives enable signal EN at 402 and data output signal DOUT at 404 and provides enable one signal EN1 at 406 and enable zero signal EN0 at 408.

Enable circuit 400 includes a first AND gate 410, a second AND gate 412, and an inverter 414. One input of first AND gate 410 receives enable signal EN at 402. The other input of first AND gate 410 and the input of inverter 414 receive data output signal DOUT at 404. The output of inverter 414 is electrically coupled at 416 to one input of second AND gate 412. The other input of second AND gate 412 receives enable signal EN at 402.

In operation, if enable signal EN at 402 is inactive or at a low logic level, first AND gate 410 provides an inactive, low logic level, enable zero signal EN0 at 408 and second AND gate 412 provides an inactive, low logic level, enable one signal EN1 at 406. If enable signal EN at 402 is active or at a high logic level, the value of data output signal DOUT at 404 determines the values of enable one signal EN1 at 406 and enable zero signal EN0 at 408.

If data output signal DOUT at 404 is at a low logic level, enable zero signal EN0 at 408 is at a low logic level and enable one signal EN1 at 406 is at a high logic level. In one embodiment, the high logic level in enable one signal EN1 at 406 enables a receiver, such as receiver 300 of FIG. 6 and receiver one 214 (shown in FIG. 5), to enable switching of data output signal DOUT at 404 to a high logic level.

If data output signal DOUT at 404 is at a high logic level, enable one signal EN1 at 406 is at a low logic level and enable zero signal EN0 at 408 is at a high logic level. In one embodiment, the high logic level in enable zero signal EN0 at 408 enables a receiver, such as receiver 300 of FIG. 6 and receiver zero 216 (shown in FIG. 5), to enable switching of data output signal DOUT at 404 to a low logic level.

Figure 9:
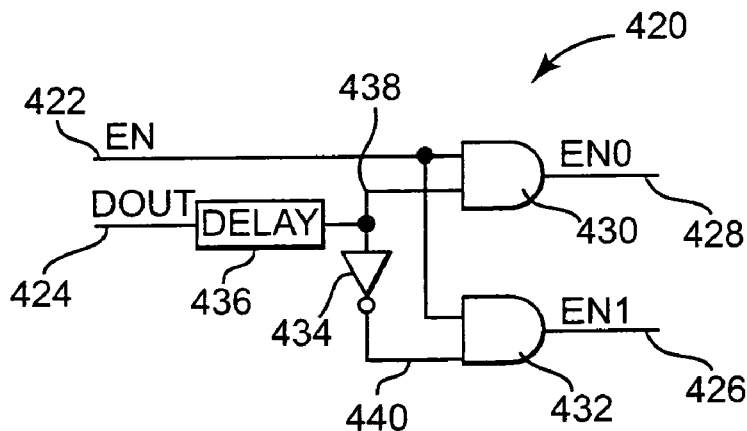
FIG. 9 is a diagram illustrating one embodiment of an enable circuit including a delay circuit.

FIG. 9 is a diagram illustrating one embodiment of an enable circuit 420. Enable circuit 420 is similar to enable circuit 112 (shown in FIG. 4). Enable circuit 420 receives enable signal EN at 422 and data output signal DOUT at 424 and provides enable one signal EN1 at 426 and enable zero signal EN0 at 428.

Enable circuit 420 includes a first AND gate 430, a second AND gate 432, an inverter 434, and a delay circuit 436. One input of first AND gate 430 and one input of second AND gate 432 receive enable signal EN at 422. The input of delay circuit 436 receives data output signal DOUT at 424 and the output of delay circuit 436 is electrically coupled at 438 to the other input of first AND gate 430 and the input of inverter 434. Delay circuit 436 delays data output signal DOUT at 424 a delay time to provide a delayed data output signal at 438 to first AND gate 430 and inverter 434. The output of inverter 434 is electrically coupled at 440 to the other input of second AND gate 432.

If enable signal EN at 422 is inactive or at a low logic level, first AND gate 430 provides an inactive, low logic level, enable zero signal EN0 at 428 and second AND gate 432 provides an inactive, low logic level, enable one signal EN1 at 426. If enable signal EN at 422 is active or at a high logic level, the values of enable one signal EN1 at 426 and enable zero signal EN0 at 428 are based on the value of the delayed data output signal at 438. If the delayed data output signal at 438 is at a low logic level, enable zero signal EN0 at 428 is at a low logic level and enable one signal EN1 at 426 is at a high logic level. If the delayed data output signal at 438 is at a high logic level, enable one signal EN1 at 426 is at a low logic level and enable zero signal EN0 at 428 is at a high logic level. In one embodiment, the high logic level in enable one signal EN1 at 426 enables a receiver, such as receiver 300 of FIG. 6 and receiver one 214 (shown in FIG. 5), to enable switching of data output signal DOUT at 424 to a high logic level. In one embodiment, the high logic level in enable zero signal EN0 at 428 enables a receiver, such as receiver 300 of FIG. 6 and receiver zero 216 (shown in FIG. 5), to enable switching of data output signal DOUT at 424 to a low logic level.

In operation, if enable signal EN at 422 is active or at a high logic level, one of the enable signals of enable one signal EN1 at 426 and enable zero signal EN0 at 428 is active based on the value of the delayed data output signal at 438. Delay circuit 436 receives and delays data output signal DOUT at 424 to provide the delayed data output signal at 438 to first AND gate 430 and inverter 434. If data output signal DOUT at 424 switches from one logic level to the other logic level, such as via an activated receiver, the delayed data output signal at 438 remains the same for the delay time of delay circuit 436 after the transition in data output signal DOUT at 424. The delayed data output signal at 438 holds one of the enable signals of enable one signal EN1 at 426 and enable zero signal EN0 at 428 active for the delay time of the delay circuit 436 after the transition of data output signal DOUT at 424. This delay time is sufficient to allow data output signal DOUT at 424 to switch prior to deactivating an activated receiver. In one embodiment, enable signal EN at 422 is active for an active time and delay circuit 436 delays data output signal DOUT at 424 for a delay time that is substantially equal to the active time.

Figure 10:
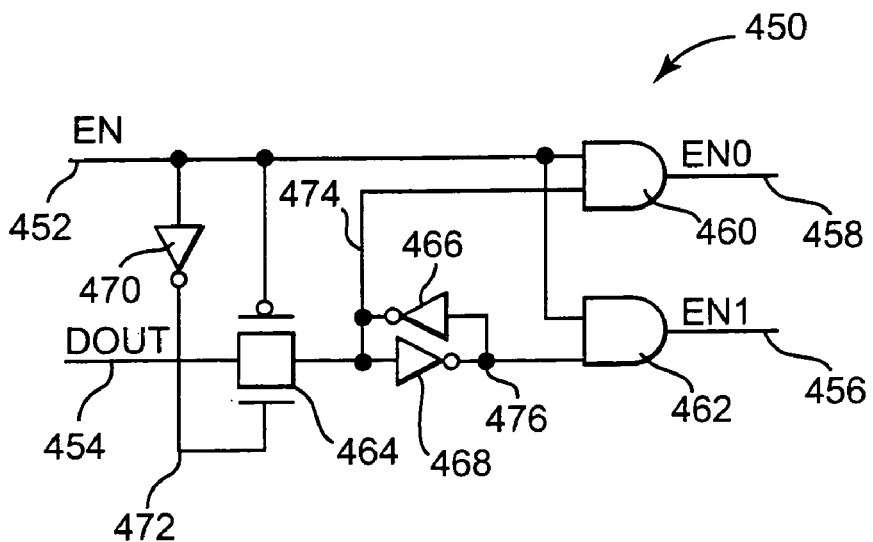
FIG. 10 is a diagram illustrating one embodiment of an enable circuit including a transmission gate.

FIG. 10 is a diagram illustrating one embodiment of an enable circuit 450. Enable circuit 450 is similar to enable circuit 112 (shown in FIG. 4). Enable circuit 450 receives enable signal EN at 452 and data output signal DOUT at 454 and provides enable one signal EN1 at 456 and enable zero signal EN0 at 458.

Enable circuit 450 includes a first AND gate 460, a second AND gate 462, a transmission gate 464, a first inverter 466, a second inverter 468, and a third inverter 470. One input of first AND gate 460 and one input of second AND gate 462 receive enable signal EN at 452. Also, transmission gate 464 and the input of third inverter 470 receive enable signal EN at 452. The output of third inverter 470 is electrically coupled at 472 to transmission gate 464. Transmission gate 464 receives data output signal DOUT 454 and transmission gate 464 is turned on to conduct data output signal DOUT 454 if enable signal EN at 452 is at an inactive, low voltage level. Transmission gate 464 is turned off to not conduct data output signal DOUT at 454 if enable signal EN at 452 is at an active, high voltage level.

The other input of first AND gate 460 and the input of second inverter 468 are electrically coupled at 474 to the output of first inverter 466 and transmission gate 464. If transmission gate 464 is conducting, the other input of first AND gate 460 and the input of second inverter 468 receive data output signal DOUT at 454 via transmission gate 464. The output of second inverter 468 is electrically coupled at 476 to the input of first inverter 466 and the other input of second AND gate 462.

If enable signal EN at 452 is inactive or at a low logic level, first AND gate 460 provides an inactive, low logic level, enable zero signal EN0 at 458 and second AND gate 462 provides an inactive, low logic level, enable one signal EN1 at 456. Also, transmission gate 464 conducts data output signal DOUT at 454, which is latched in at 474 via first inverter 466 and second inverter 468. An inverted data output signal at 476 is provided to the input of second AND gate 462.

As enable signal EN at 452 transitions to an active or high logic level, transmission gate 464 stops conducting data output signal DOUT at 454 and the values of enable one signal EN1 at 456 and enable zero signal EN0 at 458 are based on the value of the latched in data output signal at 474. If the latched in data output signal at 474 is at a low logic level, enable zero signal EN0 at 458 is at a low logic level and enable one signal EN1 at 456 is at a high logic level. If the latched in data output signal at 474 is at a high logic level, enable one signal EN1 at 456 is at a low logic level and enable zero signal EN0 at 458 is at a high logic level. In one embodiment, the high logic level in enable one signal EN1 at 456 enables a receiver, such as receiver 300 of FIG. 6 and receiver one 214 (shown in FIG. 5), to enable switching of data output signal DOUT at 454 to a high logic level. In one embodiment, the high logic level in enable zero signal EN0 at 458 enables a receiver, such as receiver 300 of FIG. 6 and receiver zero 216 (shown in FIG. 5), to enable switching of data output signal DOUT at 454 to a low logic level.

In operation, if enable signal EN at 452 transitions to an active or high logic level, transmission gate 464 stops conducting data output signal DOUT at 454 and the values of enable one signal EN1 at 456 and enable zero signal EN0 at 458 are based on the value of the latched in data output signal at 474. One of the enable signals of enable one signal EN1 at 456 and enable zero signal EN0 at 458 is active based on the value of the latched in data output signal at 474. If data output signal DOUT at 454 switches from one logic level to the other logic level, such as via an activated receiver, the latched in data output signal at 474 stays the same until enable signal EN at 452 transitions to an inactive or low logic level. The latched in data output signal at 474 holds the active one of the enable signals of enable one signal EN1 at 426 and enable zero signal EN0 at 428 active until enable signal EN at 452 transitions to the inactive or low logic level. The latched in data output signal at 474 ensures that data output signal DOUT at 424 switches prior to deactivating an activated receiver.

Figure 11:
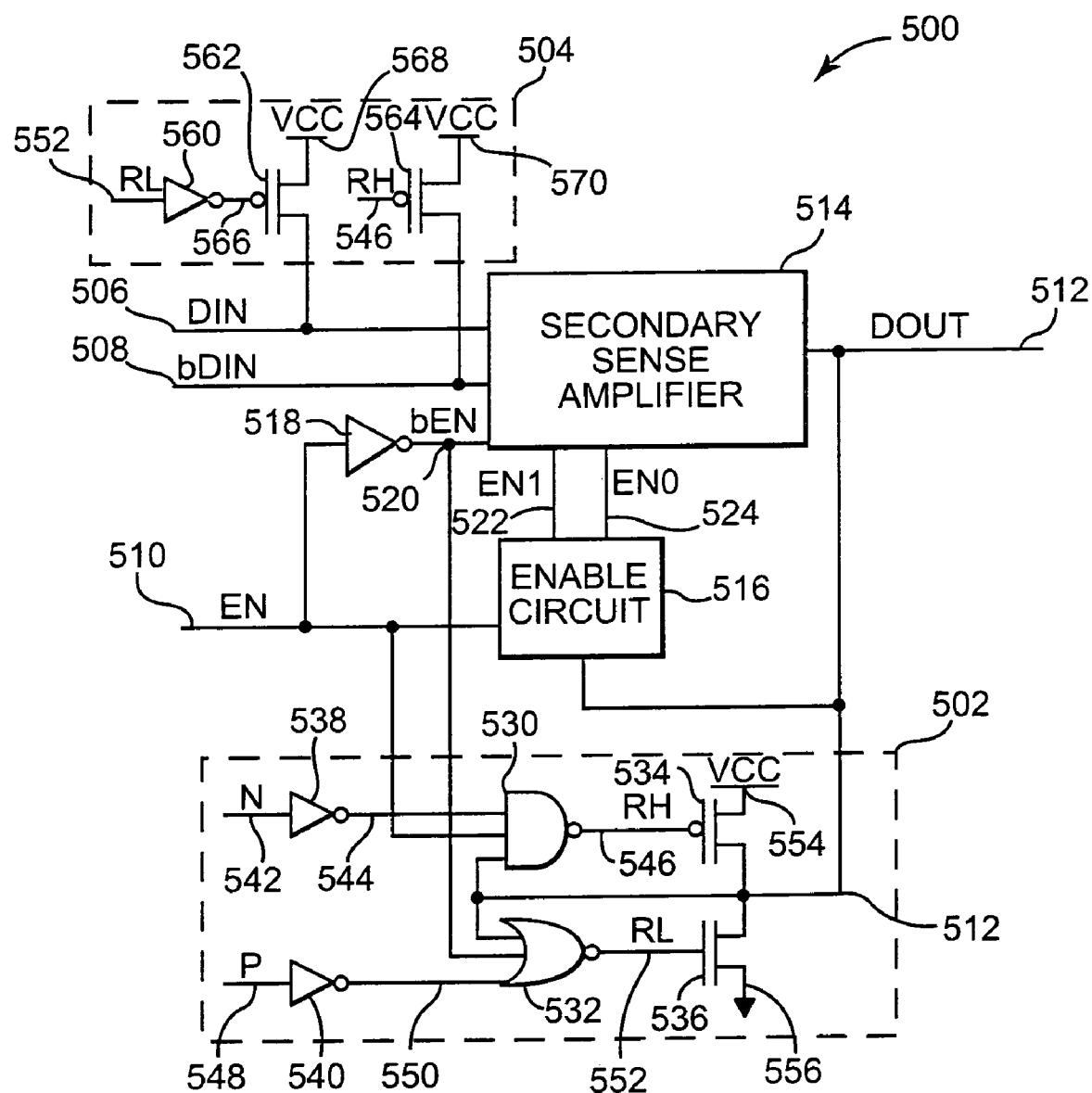
FIG. 11 is a diagram illustrating one embodiment of an output circuit including a recharge circuit and a bias circuit.

FIG. 11 is a diagram illustrating one embodiment of an output circuit 500 including a recharge circuit 502 and a bias circuit 504. Output circuit 500 is similar to output circuit 28 (shown in FIG. 1) and output circuit 80 (shown in FIG. 2). Also, output circuit 500 is similar to output circuit 100 of FIG. 4 with the addition of recharge circuit 502 and bias circuit 504. Output circuit 500 receives a data input signal DIN at 506, an inverted data input signal bDIN at 508, and an enable signal EN at 510 and provides a data output signal DOUT at 512.

Recharge circuit 502 recharges or refreshes data output signal DOUT at 512 to prevent data output signal DOUT at 512 from inadvertently switching logic levels, such as inadvertently switching logic levels due to charging and discharging via capacitive coupling with nearby signal lines. Bias circuit 504 pulls one of data input signal DIN at 506 and inverted data input signal bDIN at 508 to a high voltage level to prevent voltage sagging and to increase the sensitivity of output circuit 500 to differences between data input signal DIN at 506 and inverted data input signal bDIN at 508.

Data input signal DIN at 506 and inverted data input signal bDIN at 508 indicate data bit signal values, such as high logic levels (i.e., ones) and low logic levels (i.e., zeroes). Data output signal DOUT at 512 is updated or changed as needed to provide data output signal values that correspond to the data bit signal values indicated via received data input signal DIN at 506 and inverted data input signal bDIN at 508. In one embodiment, a high logic level is indicated if data input signal DIN at 506 is greater than inverted data input signal bDIN at 508 and a low logic level is indicated if data input signal DIN at 506 is less than inverted data input signal bDIN at 508. In one embodiment, data input signal DIN at 506 and inverted data input signal bDIN at 508 are received from a primary sense amplifier in a RAM and data input signal DIN at 506 and inverted data input signal bDIN at 508 indicate the logic level of a data bit from a memory cell in the RAM.

Output circuit 500 includes a secondary sense amplifier 514, an enable circuit 516, an inverter 518, recharge circuit 502, and bias circuit 504. Secondary sense amplifier 514 is electrically coupled to inverter 518 via inverter communications path 520 and to enable circuit 516 via enable one communications path 522 and enable zero communications path 524. Inverter 518 receives enable signal EN at 510 and provides an inverted enable signal bEN at 520.

Enable circuit 516 is similar to enable circuit 112 (shown in FIG. 4). Also, enable circuit 516 is similar to enable circuit 400 of FIG. 8, enable circuit 420 of FIG. 9, and enable circuit 450 of FIG. 10. Enable circuit 516 receives enable signal EN at 510 and data output signal DOUT at 512 and provides enable one signal EN1 at 522 and enable zero signal EN0 at 524. If enable signal EN at 510 is active, enable circuit 516 provides one active enable signal in enable one signal EN1 at 522 and enable zero signal EN0 at 524 and one inactive enable signal in enable one signal EN1 at 522 and enable zero signal EN0 at 524. If enable signal. EN at 522 is inactive, enable circuit 516 provides inactive enable signals in enable one signal EN1 at 522 and enable zero signal EN0 at 524.

Enable circuit 516 provides active and inactive enable signals based on data output signal DOUT at 512. If data output signal DOUT at 512 is a low logic level (i.e., a zero), enable circuit 516 provides an active enable one signal EN1 at 522 and an inactive enable zero signal EN0 at 524. If data output signal DOUT at 512 is a high logic level (i.e., a one), enable circuit 516 provides an active enable zero signal EN0 at 524 and an inactive enable one signal EN1 at 522.

Secondary sense amplifier 514 is similar to secondary sense amplifier 110 (shown in FIG. 4). Also, secondary sense amplifier 514 is similar to secondary sense amplifier 200 of FIG. 5. Secondary sense amplifier 514 receives data input signal DIN at 506 and inverted data input signal bDIN at 508 and includes receivers, such as receiver one at 214 and receiver zero at 216 (shown in FIG. 5). The receivers are configured to differentiate between data input signal DIN at 506 and inverted data input signal bDIN at 508. One of the two receivers, such as receiver one 214, is configured to switch data output signal DOUT at 512 to a high logic level if the data bit signal value indicated via data input signal DIN at 506 and inverted data input signal bDIN at 508 is at a high logic level and to leave data output signal DOUT at 512 at a low logic level if the data bit signal value indicated via data input signal DIN at 506 and inverted data input signal bDIN at 508 is at a low logic level. The other one of the two receivers, such as receiver zero 216, is configured to switch data output signal DOUT at 512 to a low logic level if the data bit signal value indicated via data input signal DIN at 506 and inverted data input signal bDIN at 508 is at a low logic level and to leave data output signal DOUT at 512 at a high logic level if the data bit signal value indicated via data input signal DIN at 506 and inverted data input signal bDIN at 508 is at a high logic level.

Secondary sense amplifier 514 receives inverted enable signal bEN at 520 and activates internal circuitry, such as driver control circuit 218 (shown in FIG. 5) that provides output signal P at 228 and output signal N at 230, to update data output signal DOUT at 512. Secondary sense amplifier 514 deactivates the internal circuitry via an inactive inverted enable signal bEN at 520 to latch in data output signal DOUT at 512.

Also, secondary sense amplifier 514 receives enable one signal EN1 at 522 and enable zero signal EN0 at 524 and activates receivers, such as receiver one at 214 and receiver zero at 216, based on the enable one signal EN1 at 522 and the enable zero signal EN0 at 524. If enable signal EN at 510 is inactive, enable circuit 516 provides inactive enable signals in enable one signal EN1 at 522 and enable zero signal EN0 at 524 and secondary sense amplifier 514 deactivates the two receivers. Also, in this situation, inverted enable signal bEN at 520 is inactive and the internal circuitry is deactivated via inverted enable signal bEN at 520 to latch in data output signal DOUT at 512.

If enable signal EN at 520 is active, enable circuit 516 provides one active enable signal and one inactive enable signal in enable one signal EN1 at 522 and enable zero signal EN0 at 524 and secondary sense amplifier 514 activates one of the receivers and deactivates the other one of the receivers. If enable one signal EN1 at 522 is active and enable zero signal EN0 at 524 is inactive, secondary sense amplifier 514 activates the one of the two receivers, such as receiver one 214, that is configured to switch data output signal DOUT at 512 to a high logic level if the data bit signal value indicated via data input signal DIN at 506 and inverted data input signal bDIN at 508 is a high logic level. The other receiver, such as receiver zero 216, is disabled or deactivated via the inactive enable zero signal EN0 at 524. If enable zero signal EN0 at 524 is active and enable one signal EN1 at 522 is inactive, secondary sense amplifier 514 activates the one of the two receivers, such as receiver zero 216, that is configured to switch data output signal DOUT at 512 to a low logic level if the data bit signal value indicated via data input signal DIN at 506 and inverted data input signal bDIN at 508 is a low logic level. The other receiver, such as receiver one 214, is deactivated via the inactive enable one signal EN1 at 522. Also, in this situation, inverted enable signal bEN at 520 is active and the internal circuitry, such as driver control circuit 218, is activated via inverted enable signal bEN at 520 to update data output signal DOUT at 512.

Recharge circuit 502 includes a NAND gate 530, a NOR gate 532, a PMOS transistor 534, an NMOS transistor 536, a first inverter 538, and a second inverter 540. The input of first inverter 538 receives output signal N at 542 and the output of first inverter 538 is electrically coupled at 544 to one input of NAND gate 530. Another input of NAND gate 530 receives enable signal EN at 510 and a third input of NAND gate 530 receives data output signal DOUT at 512. The output of NAND gate 530 is electrically coupled at 546 to the gate of PMOS transistor 534.

The input of second inverter 540 receives output signal P at 548 and the output of second inverter 540 is electrically coupled at 550 to one input of NOR gate 532. Another input of NOR gate 532 receives inverted enable signal bEN at 520 and a third input of NOR gate 532 receives data output signal DOUT at 512. The output of NOR gate 532 is electrically coupled at 552 to the gate of NMOS transistor 536.

One side of the drain-source path of PMOS transistor 534 is electrically coupled to a power supply voltage, such as VCC, at 554. The other side of the drain-source path of PMOS transistor 534 is electrically coupled at 512 to one side of the drain-source path of NMOS transistor 536. The other side of the drain-source path of NMOS transistor 536 is electrically coupled to a reference, such as ground, at 556.

If enable signal EN at 510 is at an inactive or low logic level, inverted enable signal bEN is at an inactive or high logic level and internal circuitry in secondary sense amplifier 514, such as driver control circuit 218 (shown in FIG. 5), provides a low logic level output signal N at 542 and a high logic level output signal P at 548. Also, NAND gate 530 provides a high logic level in output signal RH at 546 and NOR gate 532 provides a low logic level in output signal RL at 552. The high logic level in output signal RH at 546 turns off PMOS transistor 534 and the low logic level in output signal RL at 552 turns off NMOS transistor 536 to provide a high impedance output at 512. Data output signal DOUT at 512 remains unchanged.

If enable signal EN at 510 transitions to an active or high logic level, inverted enable signal bEN at 520 transitions to an active or low logic level. Internal circuitry in secondary sense amplifier 514, such as driver control circuit 218 (shown in FIG. 5), continues to provide a low logic level output signal N at 542 and a high logic level output signal P at 548. First inverter 538 provides a high logic level at 544 to NAND gate 530 and second inverter 540 provides a low logic level at 550 to NOR gate 532. The outputs of NAND gate 530 and NOR gate 532 are determined by the value of data output signal DOUT at 512.

If data output signal DOUT at 512 is at a low logic level, NAND gate 530 provides a high logic level in output signal RH at 546 and NOR gate 532 provides a high logic level in output signal RL at 552. The high logic level in output signal RH at 546 turns off PMOS transistor 534 and the high logic level in output signal RL at 552 turns on NMOS transistor 536 to pull and hold data output signal DOUT at 512 at the low logic level. If the internal circuitry in secondary sense amplifier 514 switches output signal P at 548 to a low logic level to switch data output signal DOUT at 512 to a high logic level, second inverter 540 provides a high logic level to NOR gate 532 and NOR gate 532 provides a low logic level in output signal RL at 552 that turns off NMOS transistor 536. Also, as data output signal DOUT at 512 switches to a high logic level, NAND gate 530 provides a low logic level in output signal RH at 546 that turns on PMOS transistor 534 to hold data output signal DOUT at 512 at the high logic level.

If data output signal DOUT at 512 is at a high logic level, NAND gate 530 provides a low logic level in output signal RH at 546 and NOR gate 532 provides a low logic level in output signal RL at 552. The low logic level in output signal RH at 546 turns on PMOS transistor 534 and the low logic level in output signal RL at 552 turns off NMOS transistor 536 to pull and hold data output signal DOUT at 512 at the high logic level. If the internal circuitry in secondary sense amplifier 514 switches output signal N at 542 to a high logic level to switch data output signal DOUT at 512 to a low logic level, first inverter 538 provides a low logic level to NAND gate 530 and NAND gate 530 provides a high logic level in output signal RH at 546 that turns off PMOS transistor 534. Also, as data output signal DOUT at 512 switches to a low logic level, NOR gate 532 provides a high logic level in output signal RL at 552 that turns on NMOS transistor 536 to hold data output signal DOUT at 512 at the low logic level.

Bias circuit 504 includes a bias circuit inverter 560, a first PMOS transistor 562, and a second PMOS transistor 564. Bias circuit inverter 560 receives output signal RL at 552 from recharge circuit 502 and the output of bias circuit inverter 560 is electrically coupled at 566 to the gate of first PMOS transistor 562. One side of the drain-source path of first PMOS transistor 562 is electrically coupled to a power supply voltage, such as VCC, at 568. The other side of the drain-source path of first PMOS transistor 562 is electrically coupled to secondary sense amplifier 514 at data input signal DIN at 506. The gate of second PMOS transistor 564 receives output signal RH at 546 from recharge circuit 502. One side of the drain-source path of second PMOS transistor 564 is electrically coupled to a power supply voltage, such as VCC, at 570. The other side of the drain-source path of second PMOS transistor 564 is electrically coupled to secondary sense amplifier 514 at inverted data input signal bDIN at 508.

If output signal RL is at a high voltage level to hold data output signal DOUT at 512 at a low logic level, bias circuit inverter 560 provides a low logic level to first PMOS transistor 562, which turns on first PMOS transistor 562 and holds data input signal DIN at 506 at a high logic level. A decrease in the voltage level of inverted data input signal bDIN at 508 indicates a high logic level data bit value and secondary sense amplifier 514 switches data output signal DOUT at 512 to a high logic level. Holding data input signal DIN at 506 at a high logic level to prevent sagging increases the sensitivity of output circuit 500 to detecting a high logic level data bit value as indicated via data input signal DIN at 506 and inverted data input signal bDIN at 508.

If output signal RH is at a low voltage level to hold data output signal DOUT at 512 at a high logic level, second PMOS transistor 564 is turned on to hold inverted data input signal bDIN at 508 at a high logic level. A decrease in the voltage level of data input signal DIN at 506 indicates a low logic level data bit value and secondary sense amplifier 514 switches data output signal DOUT at 512 to a low logic level. Holding inverted data input signal bDIN at 508 at a high logic level to prevent sagging increases the sensitivity of output circuit 500 to detecting a low logic level data bit value as indicated via data input signal DIN at 506 and inverted data input signal bDIN at 508.

In one example operation, enable signal EN at 510 is at an inactive low logic level and output signal RH at 546 is at a high logic level to turn off PMOS transistor 534 and second PMOS transistor 564. Also, output signal RL at 552 is at a low logic level to turn off NMOS transistor 536 and first PMOS transistor 562. Data output signal DOUT at 512 remains unchanged.

Next, enable signal EN at 510 is switched to an activated high logic level and output signal RH at 546 and output signal RL at 552 are determined by data output signal DOUT at 512. Secondary sense amplifier 514 provides a low logic level in data output signal DOUT at 512, which is fed back to enable circuit 516 and recharge circuit 502. Output signal RH at 546 is at a high logic level to turn off PMOS transistor 534 and second PMOS transistor 564. Output signal RL at 552 is at a high logic level to turn on NMOS transistor 536 and hold data output signal DOUT at 512 at the low logic level. Also, output signal RL at 552 is at a high logic level to turn on first PMOS transistor 562 and hold data input signal DINT at 506 at a high logic level.

Enable circuit 516 receives the low logic level in data output signal DOUT at 512 and provides an active enable one signal EN1 at 522 and an inactive enable zero signal EN0 at 524. Secondary sense amplifier 514 receives the active enable one signal EN1 at 522 and the inactive enable zero signal EN0 at 524 and activates the one of the two receivers, such as receiver one 214 (shown in FIG. 5), that is configured to switch data output signal DOUT at 512 to a high logic level if inverted data input signal bDIN at 508 decreases to indicate a high logic level data bit value. The other receiver, such as receiver zero 216 (shown in FIG. 5), is disabled or inactivated via the inactive enable zero signal EN0 at 524.

If data input signal DIN at 506 and inverted data input signal bDIN at 508 indicate a high logic level, the activated receiver and secondary sense amplifier 514 switch data output signal DOUT at 512 to a high logic level. Output signal P at 548 transitions to a low logic level and output signal RL transitions to a low logic level to turn off NMOS transistor 536 and first PMOS transistor 562. As data output signal DOUT at 512 transitions to a high logic level, output signal RH at 546 transitions to a low logic level to turn on PMOS transistor 534 and second PMOS transistor 564. Data output signal DOUT at 512 is held at the high logic level and inverted data input signal bDIN at 508 is pulled to a high voltage level.

If instead of indicating a high logic level, data input signal DIN at 506 decreases below inverted data input signal bDIN at 508 to indicate a low logic level, the activated receiver and secondary sense amplifier 514 leave data output signal DOUT at 512 at the low logic level. Output signal RL at 552 is at the high logic level to turn on NMOS transistor 536 and hold data output signal DOUT at 512 at the low logic level. Also, output signal RL at 552 is at a high logic level to turn on first PMOS transistor 562 and hold data input signal DIN at 506 at a high logic level. Data output signal DOUT at 512 provides the data bit value indicated via data input signal DIN at 506 and inverted data input signal bDIN at 508. Enable signal EN at 510 transitions to an inactive low logic level and output signal RH at 546 is at a high logic level to turn off PMOS transistor 534 and second PMOS transistor 564. Also, output signal RL at 552 is at a low logic level to turn off NMOS transistor 536 and first PMOS transistor 562. Data output signal DOUT at 512 remains unchanged.

In another example operation, enable signal EN at 510 is at an inactive low logic level and output signal RH at 546 is at a high logic level to turn off PMOS transistor 534 and second PMOS transistor 564. Also, output signal RL at 552 is at a low logic level to turn off NMOS transistor 536 and first PMOS transistor 562. Data output signal DOUT at 512 remains unchanged.

Next, enable signal EN at 510 is switched to an activated high logic level and output signal RH at 546 and output signal RL at 552 are determined by data output signal DOUT at 512. Secondary sense amplifier 514 provides a high logic level in data output signal DOUT at 512, which is fed back to enable circuit 516 and recharge circuit 502. Output signal RL at 552 is at a low logic level to turn off NMOS transistor 536 and first PMOS transistor 562. Output signal RH at 546 is at a low logic level to turn on PMOS transistor 534 and hold data output signal DOUT at 512 at the high logic level. Also, output signal RH at 546 is at a low logic level to turn on second PMOS transistor 564 and hold inverted data input signal bDIN at 508 at a high logic level.

Enable circuit 516 receives the high logic level in data output signal DOUT at 512 and provides an inactive enable one signal EN1 at 522 and an active enable zero signal EN0 at 524. Secondary sense amplifier 514 receives the inactive enable one signal EN1 at 522 and the active enable zero signal EN0 at 524 and activates the one of the two receivers, such as receiver zero 216 (shown in FIG. 5), that is configured to switch data output signal DOUT at 512 to a low logic level if data input signal DINT at 506 decreases to indicate a low logic level data bit value. The other receiver, such as receiver one 214 (shown in FIG. 5), is disabled or inactivated via the inactive enable one signal EN1 at 522.

If data input signal DIN at 506 and inverted data input signal bDIN at 508 indicate a low logic level, the activated receiver and secondary sense amplifier 514 switch data output signal DOUT at 512 to a low logic level. Output signal N at 542 transitions to a high logic level and output signal RH transitions to a high logic level to turn off PMOS transistor 534 and second PMOS transistor 564. As data output signal DOUT at 512 transitions to a low logic level, output signal RL at 552 transitions to a high logic level to turn on NMOS transistor 536 and first PMOS transistor 562. Data output signal DOUT at 512 is held at the low logic level and data input signal DIN at 506 is pulled to a high voltage level.

If instead of indicating a low logic level, inverted data input signal bDIN at 508 decreases below data input signal DIN at 506 to indicate a high logic level, the activated receiver and secondary sense amplifier 514 leave data output signal DOUT at 512 at the high logic level. Output signal RH at 546 is at the low logic level to turn on PMOS transistor 534 and hold data output signal DOUT at 512 at the high logic level. Also, output signal RH at 546 is at a low logic level to turn on second PMOS transistor 564 and hold inverted data input signal bDIN at 508 at a high logic level. Data output signal DOUT at 512 provides the data bit value indicated via data input signal DIN at 506 and inverted data input signal bDIN at 508. Enable signal EN at 510 transitions to an inactive low logic level and output signal RH at 546 is at a high logic level to turn off PMOS transistor 534 and second PMOS transistor 564. Also, output signal RL at 552 is at a low logic level to turn off NMOS transistor 536 and first PMOS transistor 562. Data output signal DOUT at 512 remains unchanged.

Figure 12:
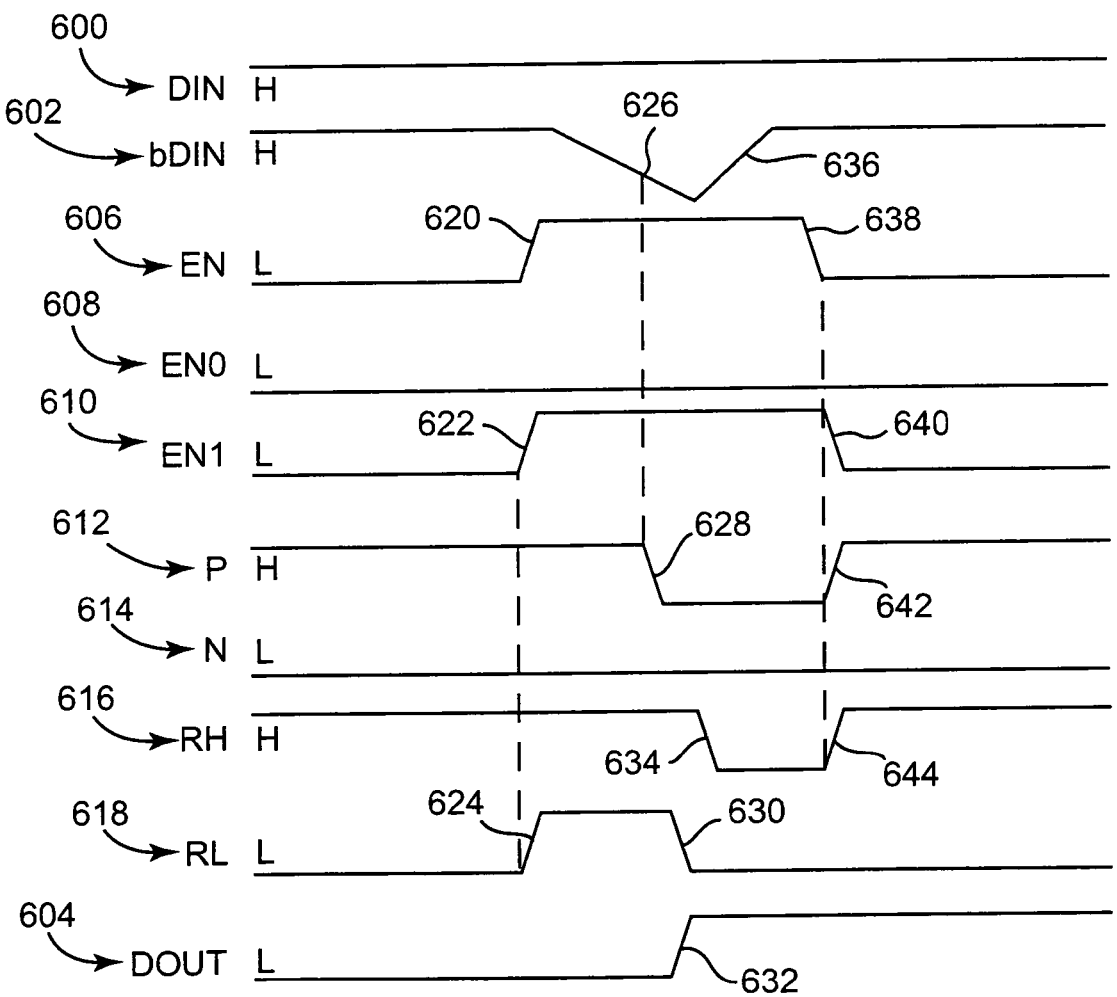
FIG. 12 is a timing diagram illustrating one example operation of one embodiment of an output circuit.

FIG. 12 is a timing diagram illustrating one example operation of one embodiment of output circuit 500 of FIG. 11. Output circuit 500 includes recharge circuit 502, bias circuit 504, secondary sense amplifier 514, and enable circuit 516. In this embodiment, secondary sense amplifier 514 is similar to secondary sense amplifier 200 of FIG. 5 and enable circuit 516 is similar to enable circuit 450 of FIG. 10.

Secondary sense amplifier 514 receives data input signal DIN at 600 and inverted data input signal bDIN at 602 and provides data output signal DOUT at 604, which is fed back to enable circuit 516 and recharge circuit 502. Enable circuit 516 receives data output signal DOUT at 604 and enable signal EN at 606 and provides enable zero signal EN0 at 608 and enable one signal EN1 at 610. Secondary sense amplifier 514 receives enable zero signal EN0 at 608, enable one signal EN1 at 610, and the inverted enable signal bEN (shown in FIGS. 5 and 11) and includes driver control circuit 218 (shown in FIG. 5) that provides output signal P at 612 and output signal N at 614. Recharge circuit 502 receives output signal P at 612, output signal N at 614, data output signal DOUT at 604, enable signal EN at 606, inverted enable signal bEN, and provides recharge high output signal RH at 616 and recharge low output signal RL at 618, which are received by bias circuit 504.

To begin, data input signal DIN at 600 and inverted data input signal bDIN at 602 are equalized to high voltage levels and enable signal EN at 606 is provided at an inactive, low logic level. Enable circuit 516 provides an inactive low logic level enable zero signal EN0 at 608 and an inactive low logic level enable one signal EN1 at 610. Also, secondary sense amplifier 514 and driver control circuit 218 provide a high logic level output signal P at 612 and a low logic level output signal N at 614. In addition, recharge circuit 502 provides a high logic level output signal RH at 616 to turn off PMOS transistor 534 and second PMOS transistor 564, and a low logic level output signal RL at 618 to turn off NMOS transistor 536 and first PMOS transistor 562. Data output signal DOUT at 604 is at a low logic level.

Next, enable signal EN at 606 transitions to an active high logic level at 620 and enable one signal EN1 at 610 transitions to a high logic level at 622. In recharge circuit 502, output signal RL at 618 transitions to a high logic level at 624. Output signal RH at 616 is at a high logic level to turn off PMOS transistor 534 and second PMOS transistor 564 and output signal RL at 618 is at a high logic level to turn on NMOS transistor 536 and hold data output signal DOUT at 604 at the low logic level. Also, output signal RL at 618 is at a high logic level to turn on first PMOS transistor 562 and hold data input signal DIN at 600 at a high logic level.

Secondary sense amplifier 514 receives the active enable one signal EN1 at 610 and activates receiver one 214 (shown in FIG. 5). Receiver one 214 is configured to switch data output signal DOUT at 604 to a high logic level if inverted data input signal bDIN at 602 decreases to indicate a high logic level data bit value. Receiver zero 216 (shown in FIG. 5) is deactivated via the inactive enable zero signal EN0 at 608.

Inverted data input signal bDIN at 602 decreases at 626 to indicate a high logic level and output signal P at 612 transitions to a low logic level at 628. In recharge circuit 502, output signal RL at 618 transitions to a low logic level at 630 to turn off NMOS transistor 536 and first PMOS transistor 562. Data output signal DOUT at 604 transitions to a high logic level at 632 and as data output signal DOUT at 604 transitions to a high logic level at 632, output signal RH at 616 transitions to a low logic level at 634 to turn on PMOS transistor 534 and second PMOS transistor 564. Data output signal DOUT at 604 is held at the high logic level and inverted data input signal bDIN at 602 is pulled to a high voltage level at 636. Data output signal DOUT at 604 provides the high logic level data bit value indicated via data input signal DIN at 600 and inverted data input signal bDIN at 602.

Enable signal EN at 606 transitions to an inactive low logic level at 638 and enable one signal EN1 at 610 transitions to an inactive low logic level at 640. Also, output signal P at 612 transitions to a high logic level at 642 and output signal RH at 616 transitions to a high logic level at 644 to turn off PMOS transistor 534 and second PMOS transistor 564. Data output signal DOUT at 604 remains at the high logic level.

Figure 13:
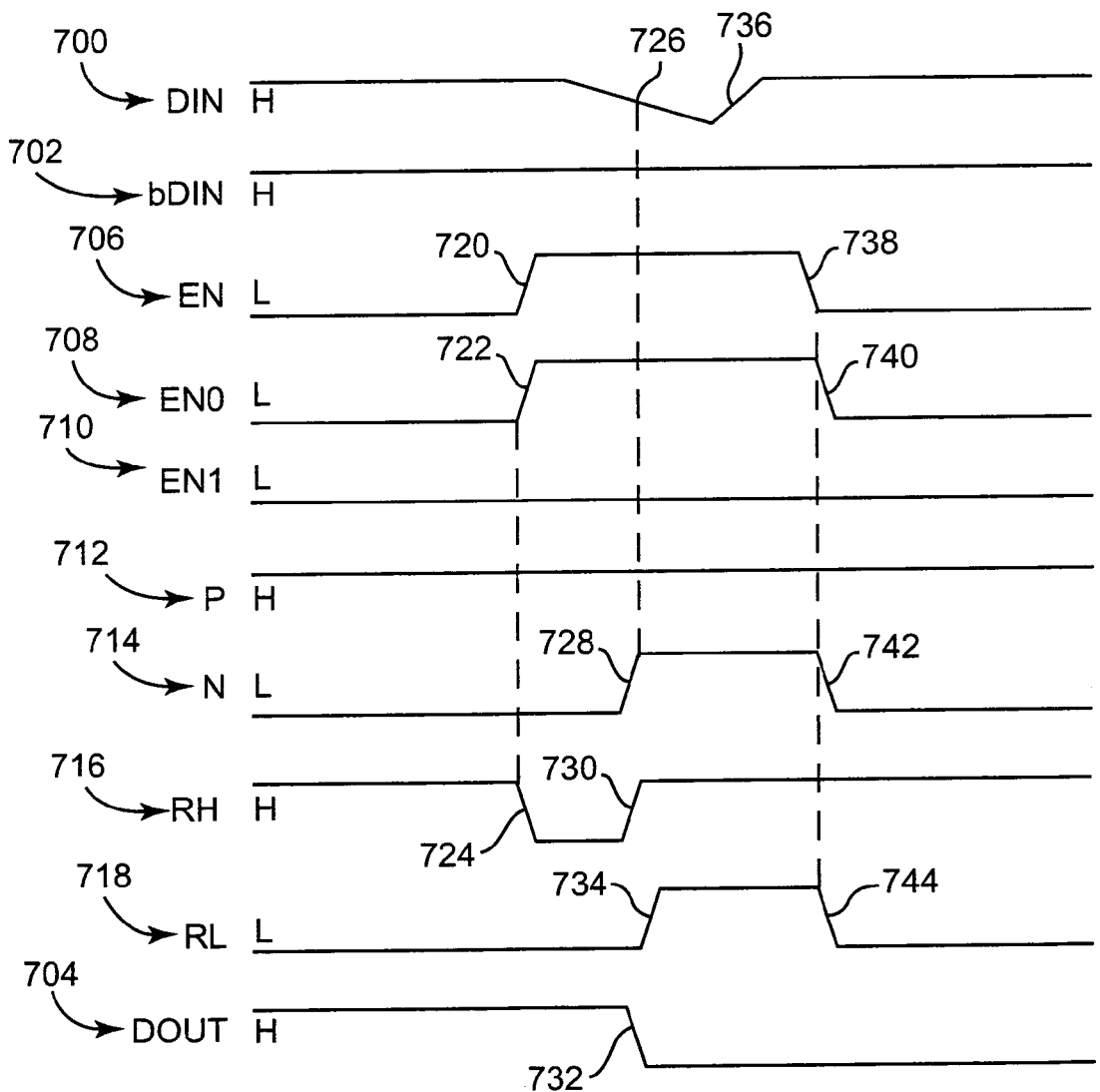
FIG. 13 is a timing diagram illustrating another example operation of one embodiment of an output circuit.

FIG. 13 is a timing diagram illustrating another example operation of one embodiment of output circuit 500 of FIG. 11. Output circuit 500 includes recharge circuit 502, bias circuit 504, secondary sense amplifier 514, and enable circuit 516. In this embodiment, secondary sense amplifier 514 is similar to secondary sense amplifier 200 of FIG. 5 and enable circuit 516 is similar to enable circuit 450 of FIG. 10.

Secondary sense amplifier 514 receives data input signal DIN at 700 and inverted data input signal bDIN at 702 and provides data output signal DOUT at 704, which is fed back to enable circuit 516 and recharge circuit 502. Enable circuit 516 receives data output signal DOUT at 704 and enable signal EN at 706 and provides enable zero signal EN0 at 708 and enable one signal EN1 at 710. Secondary sense amplifier 514 receives enable zero signal EN0 at 708, enable one signal EN1 at 710, and the inverted enable signal bEN (shown in FIGS. 5 and 11) and includes driver control circuit 218 (shown in FIG. 5) that provides output signal P at 712 and output signal N at 714. Recharge circuit 502 receives output signal P at 712, output signal N at 714, data output signal DOUT at 704, enable signal EN at 706, inverted enable signal bEN, and provides recharge high output signal RH at 716 and recharge low output signal RL at 718, which are received by bias circuit 504.

To begin, data input signal DIN at 700 and inverted data input signal bDIN at 702 are equalized to high voltage levels and enable signal EN at 706 is provided at an inactive, low logic level. Enable circuit 516 provides an inactive low logic level enable zero signal EN0 at 708 and an inactive low logic level enable one signal EN1 at 710. Also, secondary sense amplifier 514 and driver control circuit 218 provide a high logic level output signal P at 712 and a low logic level output signal N at 714. In addition, recharge circuit 502 provides a high logic level output signal RH at 716 to turn off PMOS transistor 534 and second PMOS transistor 564, and a low logic level output signal RL at 718 to turn off NMOS transistor 536 and first PMOS transistor 562. Data output signal DOUT at 704 is at a high logic level.

Next, enable signal EN at 706 transitions to an active high logic level at 720 and enable zero signal EN0 at 708 transitions to a high logic level at 722. In recharge circuit 502, output signal RH at 716 transitions to a low logic level at 724. Output signal RL at 718 is at a low logic level to turn off NMOS transistor 536 and first PMOS transistor 562 and output signal RH at 716 is at a low logic level to turn on PMOS transistor 534 and hold data output signal DOUT at 704 at the high logic level. Also, output signal RH at 716 is at a low logic level to turn on second PMOS transistor 564 and hold inverted data input signal bDIN at 702 at a high logic level.

Secondary sense amplifier 514 receives the active enable zero signal EN0 at 708 and activates receiver zero 216 (shown in FIG. 5). Receiver zero 216 is configured to switch data output signal DOUT at 704 to a low logic level if data input signal DIN at 700 decreases to indicate a low logic level data bit value. Receiver one 214 (shown in FIG. 5) is deactivated via the inactive enable one signal EN1 at 710.

Data input signal DIN at 700 decreases at 726 to indicate a low logic level and output signal N at 714 transitions to a high logic level at 728. In recharge circuit 502, output signal RH at 716 transitions to a high logic level at 730 to turn off PMOS transistor 534 and second PMOS transistor 564. Data output signal DOUT at 704 transitions to a low logic level at 732 and as data output signal DOUT at 704 transitions to a low logic level at 732, output signal RL at 718 transitions to a high logic level at 734 to turn on NMOS transistor 536 and first PMOS transistor 562. Data output signal DOUT at 704 is held at the low logic level and data input signal DIN at 700 is pulled to a high voltage level at 736. Data output signal DOUT at 704 provides the low logic level data bit value indicated via data input signal DIN at 700 and inverted data input signal bDIN at 702.

Enable signal EN at 706 transitions to an inactive low logic level at 738 and enable zero signal EN0 at 708 transitions to an inactive low logic level at 740. Also, output signal N at 714 transitions to a low logic level at 742 and output signal RL at 718 transitions to a low logic level at 744 to turn off NMOS transistor 536 and first PMOS transistor 562. Data output signal DOUT at 704 remains at the low logic level.

Enabling one of the two receivers, such as receiver one 214 or receiver zero 216, and deactivating the other one of the two receivers, such as receiver one 214 or receiver zero 216, reduces the amount of current consumed by an output circuit. Voltage drops along power supply lines are reduced, which increases reliability. Also, each of the two receivers can be built to consume more current to increase the speed of output circuit 500 without exceeding power resources. Reliable and higher bandwidth communications can be maintained using increased data bit speeds and an increased number of output circuits, such as output circuit 500, in parallel.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having an output circuit, comprising:
 a first circuit configured to provide a first output signal;
 a second circuit configured to provide a second output signal; and
 a third circuit configured to receive a third output signal that is based on the first output signal and the second output signal and to provide enable signals that turn on one of the first circuit and the second circuit and turn off the other of the first circuit and the second circuit based on the third output signal that is updated via the turned on one of the first circuit and the second circuit.

2. The integrated circuit having the output circuit of claim 1, wherein the third circuit delays the third output signal and provides a delayed third output signal that is used to provide the enable signals.

3. The integrated circuit having the output circuit of claim 1, wherein the third circuit latches in the third output signal and provides a latched third output signal that is used to provide the enable signals.

4. The integrated circuit having the output circuit of claim 1, comprising:
 a fourth circuit configured to receive the first output signal and the second output signal and to provide driver signals based on the first output signal and the second output signal; and
 a fifth circuit configured to update the third output signal based on the driver signals.

5. The integrated circuit having the output circuit of claim 4, comprising:
 a sixth circuit configured to maintain the third output signal based on the driver signals and the third output signal; and
 a seventh circuit configured to bias an input of the turned on one of the first circuit and the second circuit based on the driver signals and the third output signal.

6. The integrated circuit having the output circuit of claim 1, comprising:
 a fourth circuit configured to latch in the third output signal.

7. An integrated circuit including a random access memory, comprising:
 a first circuit configured to provide a first output signal;
 a second circuit configured to provide a second output signal;
 means for enabling one of the first circuit and the second circuit to activate the one of the first circuit and the second circuit based on a third output signal;
 means for disabling the other one of the first circuit and the second circuit to deactivate the other one of the first circuit and the second circuit based on the third output signal; and
 means for updating the third output signal via the enabled one of the first circuit and the second circuit.

8. The integrated circuit including the random access memory of claim 7, wherein the means for enabling and the means for disabling comprises:
 means for delaying the third output signal to provide a delayed third output signal;
 means for enabling one of the first circuit and the second circuit based on the delayed third output signal; and
 means for disabling the other one of the first circuit and the second circuit based on the delayed third output signal.

9. The integrated circuit including the random access memory of claim 7, wherein the means for enabling and the means for disabling comprises:
 means for latching the third output signal to provide a latched third output signal;
 means for enabling one of the first circuit and the second circuit based on the latched third output signal; and
 means for disabling the other one of the first circuit and the second circuit based on the latched third output signal.

10. The integrated circuit including the random access memory of claim 7, comprising:
 means for maintaining the third output signal based on the third output signal; and
 means for biasing an input of the enabled one of the first circuit and the second circuit based on the third output signal.

11. A method for outputting signals, comprising:
 providing a first output signal from a first circuit;
 providing a second output signal from a second circuit;
 enabling one of the first circuit and the second circuit to activate the one of the first circuit and the second circuit based on a third output signal;
 disabling the other one of the first circuit and the second circuit to deactivate the other one of the first circuit and the second circuit based on the third output signal; and
 updating the third output signal based on the first output signal and the second output signal via the enabled one of the first circuit and the second circuit.

12. The method of claim 11, wherein enabling and disabling comprises:
 delaying the third output signal to provide a delayed third output signal;
 enabling one of the first circuit and the second circuit based on the delayed third output signal; and
 disabling the other one of the first circuit and the second circuit based on the delayed third output signal.

13. The method of claim 11, wherein enabling and disabling comprises:
 latching the third output signal to provide a latched third output signal;
 enabling one of the first circuit and the second circuit based on the latched third output signal; and
 disabling the other one of the first circuit and the second circuit based on the latched third output signal.

14. The method of claim 11, comprising:
 recharging the third output signal based on the third output signal; and
 biasing an input of the enabled one of the first circuit and the second circuit based on the third output signal.

* * * * *